(12) United States Patent
Wada

(10) Patent No.: US 8,502,399 B2
(45) Date of Patent: Aug. 6, 2013

(54) RESIN COMPOSITION FOR ENCAPSULATING SEMICONDUCTOR AND SEMICONDUCTOR DEVICE

(75) Inventor: Masahiro Wada, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 13/376,553

(22) PCT Filed: Jun. 16, 2010

(86) PCT No.: PCT/JP2010/003990
§ 371 (c)(1),
(2), (4) Date: Dec. 6, 2011

(87) PCT Pub. No.: WO2010/150487
PCT Pub. Date: Dec. 29, 2010

(65) Prior Publication Data
US 2012/0080809 A1 Apr. 5, 2012

(30) Foreign Application Priority Data

Jun. 22, 2009 (JP) ................................ P2009-148048

(51) Int. Cl.
*H01L 23/29* (2006.01)
(52) U.S. Cl.
USPC ........... 257/789; 257/787; 257/788; 257/791; 257/793; 257/E23.121; 438/466; 438/456

(58) Field of Classification Search
USPC .......................... 257/100, 433, 667, 787–796, E31.117–E31.118, E51.02, E23.116–E23.14
See application file for complete search history.

(56) References Cited

U.S. PATENT DOCUMENTS

| 6,830,825 B2 | 12/2004 | Sumiyoshi et al. |
| 2003/0187107 A1 | 10/2003 | Sumiyoshi et al. |

FOREIGN PATENT DOCUMENTS

| CN | 1432047 A | 7/2003 |
| JP | 6-216280 A | 8/1994 |
| JP | 11-255688 A | 9/1999 |
| JP | 2003-292731 A | 10/2003 |
| JP | 2004-043613 A | 2/2004 |
| JP | 2004-059792 A | 2/2004 |
| JP | 2004-123859 A | 4/2004 |
| JP | 2007-031691 A | 2/2007 |
| WO | WO 2007/007827 A1 | 1/2007 |

OTHER PUBLICATIONS

International Search Report, PCT/JP2010/003990, Sep. 7, 2010.
Office Action issued Feb. 5, 2013, in Chinese Patent Application No. 201080027933.X.

*Primary Examiner* — Mamadou Diallo
(74) *Attorney, Agent, or Firm* — Birch, Stewart, Kolasch & Birch, LLP

(57) ABSTRACT

Disclosed is a resin composition for encapsulating a semiconductor containing a curing agent, an epoxy resin (B) and an inorganic filler (C), wherein the curing agent is a phenol resin (A) having a predetermined structure. Also disclosed is a semiconductor device obtained by encapsulating a semiconductor element with a cured product of the resin composition for encapsulating a semiconductor.

6 Claims, 7 Drawing Sheets

RESIN COMPOSITION FOR ENCAPSULATING SEMICONDUCTOR AND SEMICONDUCTOR DEVICE

TECHNICAL FIELD

The present invention relates to a resin composition for encapsulating a semiconductor and a semiconductor device.

BACKGROUND ART

A semiconductor device has been encapsulated for the purpose of protecting a semiconductor element, ensuring electric insulation and achieving easy handling property, and the transfer molding has been a mainstream with the use of an epoxy resin composition from the viewpoints of the productivity, cost, reliability and the like. In response to the market requirements of decreasing size, decreasing weight and increasing performance of electronic devices, a novel joint technology such as surface mounting has been developed and commercialized, in addition to high integration of semiconductor elements, and miniaturization and high density of semiconductor devices. This technical trend has also influenced on a resin composition for encapsulating a semiconductor, and required performance has been upgraded and diversified year by year.

For example, as for solders used for surface mounting, use of lead-free solder instead has been promoted against the background of environmental problems. The melting point of lead-free solders is higher than that of the conventional lead/tin solders, and the reflow mounting temperature is increased from conventional 220 to 240 degrees centigrade, to 240 to 260 degrees centigrade, so that resin cracks are easily formed, delamination easily occurs inside the semiconductor device, or solder resistance is not sufficient in the conventional encapsulating resin composition in some cases.

Furthermore, for the purpose of imparting flame retardance, a bromine-containing epoxy resin and an antimony oxide have been used as a flame retardant in the conventional encapsulating resin composition. However, there is a growing opportunity to eliminate such compounds from the viewpoints of recent environmental protection and improvement of safety.

Furthermore, in recent years, electronic devices such as cars and mobile phones which are intended for outdoor use have come into wide use. In these applications, the operational reliability under severer environment than the conventional personal computers or household electric appliances has been in demand. In particular, high-temperature storage characteristics have been demanded as one of mandatory requirements in automotive applications, so that it is necessary to maintain the operating and functioning of a semiconductor device at a high temperature of 150 to 180 degrees centigrade.

As a conventional technology, there have been proposed a method of enhancing high-temperature storage characteristics and solder resistance by combining an epoxy resin having a naphthalene skeleton and a phenol resin curing agent having a naphthalene skeleton (Patent Documents 1 and 2) and a method of enhancing high-temperature storage characteristics and flame resistance by combining a phosphorus containing compound (Patent Documents 3 and 4). However, it is hard to mention that a sufficient balance among flame resistance, continuous molding property and solder resistance has been achieved through these methods in some cases. As described above, with miniaturization and popularization of automotive electronic devices, there has been demanded an encapsulating resin composition which is well balanced among flame resistance, solder resistance, high-temperature storage characteristics and continuous molding property.

RELATED DOCUMENT

Patent Document 1: Japanese Laid-Open Patent Publication No. 2007-31691
Patent Document 2: Japanese Laid-Open Patent Publication No. 1994-216280
Patent Document 3: Japanese Laid-Open Patent Publication No. 2003-292731
Patent Document 4: Japanese Laid-Open Patent Publication No. 2004-43613

DISCLOSURE OF THE INVENTION

An object of the present invention is to provide a resin composition for encapsulating a semiconductor excellent in balancing flame resistance, solder resistance, high-temperature storage characteristics and continuous molding property, and a semiconductor device using the resin composition for encapsulating a semiconductor.

Such an object is achieved by the present invention specified by the matters described in the following [1] to [6].

[1] A resin composition for encapsulating a semiconductor including a phenol resin (A) containing a component represented by the following general formula (1); an epoxy resin (B); and an inorganic filler (C),

[Chemical Formula 1]

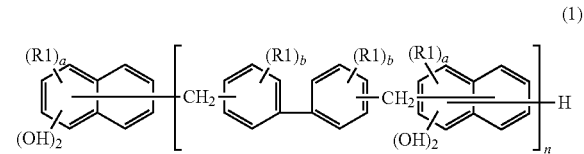

wherein, in the general formula (1), two hydroxyl groups bonded to the same naphthalene group are bonded to different carbon atoms on a naphthalene ring; R1 is each independently a hydrocarbon group having 1 to 60 carbon atoms; as are each independently an integer of 0 to 5; b is each independently an integer of 0 to 4; and n is an integer of 1 to 10.

[2] The resin composition for encapsulating a semiconductor according to [1], wherein the phenol resin (A) contains a component in which R1 in the general formula (1) is a group represented by the following general formula (2),

[Chemical Formula 2]

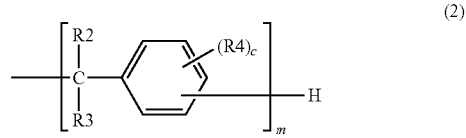

wherein, in the general formula (2), R2 and R3 are each independently a hydrogen atom or a hydrocarbon group having 1 to 3 carbon atoms; R4 is each independently a hydrocarbon group having 1 to 3 carbon atoms; c is each independently an integer of 0 to 4; and m is an integer of 1 to 5.

[3] The resin composition for encapsulating a semiconductor according to [1] or [2], wherein the phenol resin (A)

contains a component with n=0 to 2 in the general formula (1) in an amount of equal to or more than 50% by mass and equal to or less than 100% by mass, based on the total phenol resin (A).

[4] The resin composition for encapsulating a semiconductor according to any one of [1] to [3], wherein the phenol resin (A) contains a component with n=0 in the general formula (1) in an amount of equal to or more than 25% by mass and equal to or less than 70% by mass, based on the total phenol resin (A).

[5] The resin composition for encapsulating a semiconductor according to any one of [2] to [4], wherein the phenol resin (A) contains a component in which R1 is a group represented by the general formula (2) in an amount of equal to or more than 20% by area and equal to or less than 80% by area, based on the total phenol resin (A), in the area conversion method of the gel permeation chromatography (GPC) measurement method.

[6] A semiconductor device obtained by encapsulating a semiconductor element using the resin composition for encapsulating a semiconductor according to any one of [1] to [5].

Effect of the Invention

According to the present invention, there are provided a resin composition for encapsulating a semiconductor excellent in balancing flame resistance, solder resistance, high-temperature storage characteristics and continuous molding property, and a semiconductor device using the resin composition for encapsulating a semiconductor.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF EMBODIMENTS

Figure 1:
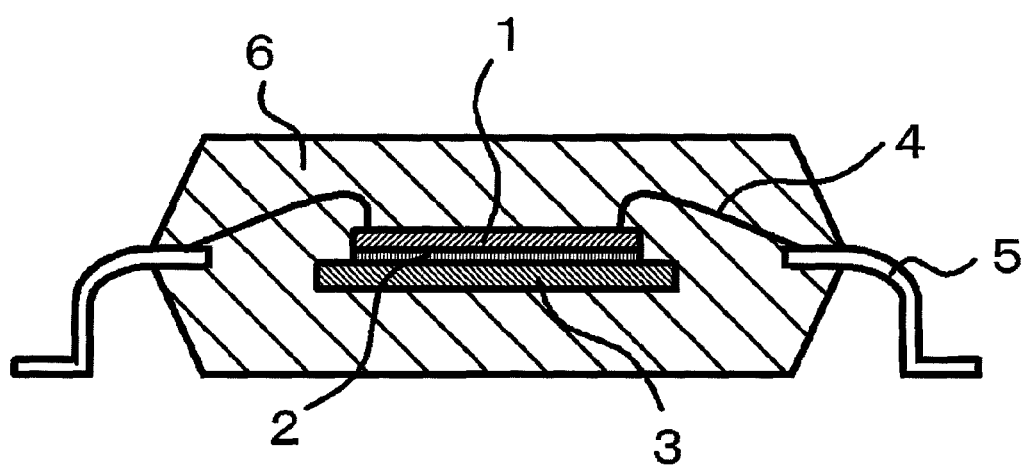
FIG. 1 is a view illustrating a cross-section structure of an example of a semiconductor device using a resin composition for encapsulating a semiconductor according to the present invention.

Preferred embodiments of the resin composition for encapsulating a semiconductor and the semiconductor device according to the present invention will be described in more detail with reference to the drawings. Incidentally, in the description of the drawings, the same components are assigned the same reference numerals and explanations thereof will not be repeated.

The resin composition for encapsulating a semiconductor of the present invention includes a phenol resin (A) represented by the following general formula (1), an epoxy resin (B), and an inorganic filler (C).

[Chemical Formula 3]

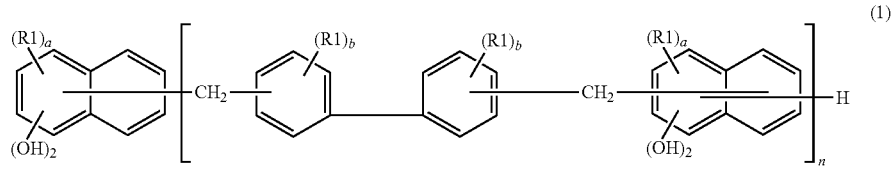

In the above general formula (1), two hydroxyl groups bonded to the same naphthalene group are bonded to different carbon atoms on a naphthalene ring; R1 is each independently a hydrocarbon group having 1 to 60 carbon atoms; as are each independently an integer of 0 to 5; b is each independently an integer of 0 to 4; and n is an integer of 0 to 10. The phenol resin (A) according to the present invention is composed of a first component in which, in the above general formula (1), n is an integer of 1 to 10, and a second component in which, in the above general formula (1), n is an integer of 0.

In the present invention, the phenol resin (A) represented by the general formula (1) (hereinafter referred to as the phenol resin (A)) is used. The phenol resin contains a naphthalene skeleton and a biphenylene skeleton in the molecule. Accordingly, flame resistance is enhanced, and the elastic modulus of a cured product is further maintained low and hydrophobicity is increased whereby solder resistance is also increased. This is considered because the content per repeating unit of the aromatic structure is increased.

The phenol resin (A) has two phenolic hydroxyl groups on a naphthalene ring in the structure, so that the hydroxyl groups are reacted with an epoxy group of the epoxy resin, and the distance between crosslinking points locally becomes short, so that in a cured product of the resin composition for encapsulating a semiconductor, the glass transition temperature becomes high and excellent curable characteristics are exhibited.

In the past, as a method of increasing high-temperature storage characteristics and flame resistance, for example, an epoxy resin having a naphthalene skeleton and a phenol resin curing agent having a naphthalene skeleton were used in combination, or a phosphorus containing compound was combined (Patent Documents 3 and 4). However, in the resin composition, the curability was lowered and continuous molding property was lowered in some cases.

On the other hand, the resin composition for encapsulating a semiconductor using the phenol resin (A) contains a biphenylaralkyl skeleton and a naphthalenediol skeleton in the structure of the phenol resin (A), whereby a cured product composed of the resin composition for encapsulating a semiconductor using the phenol resin (A) has properties combining high solder resistance and flame resistance, and combining high-temperature storage property and continuous molding property.

In the resin composition for encapsulating a semiconductor, the repeating unit n of the aforementioned phenol resin (A) of the present invention is not particularly limited as long as it is from 0 to 10 and more preferably from 0 to 5. When the resin composition for encapsulating a semiconductor is heated, melted and mixed, or kneaded within this range, it may well be kneaded. n is particularly preferably from 0 to 2. Within this range, a resin composition for encapsulating a semiconductor which is also excellent in flowability can be obtained.

The content of the component with n=0 to 2 in the phenol resin (A) is not particularly limited, but it is preferably from 50 to 100% by mass in the total phenol resin (A) (hereinafter, "to" represents both upper and lower numbers, unless otherwise particularly specified). Furthermore, the content of the component with n=0 to 2 in the phenol resin (A) is more preferably equal to or more than 60% by mass, and further preferably equal to or more than 70% by mass, based on the total phenol resin (A). When the content of the component with n=0 to 2 in the phenol resin (A) is within the above range, a resin composition for encapsulating a semiconductor excellent in flowability can be obtained.

The upper limit of the content of the component with n=0 in the phenol resin (A) is not particularly limited, but it is preferably equal to or less than 70% by mass, and more preferably equal to or less than 60% by mass, based on the total phenol resin (A). When the content of the component with n=0 is within the above upper limit, a resin composition for encapsulating a semiconductor excellent inflame resistance and solder resistance can be obtained. The lower limit of the content of the component with n=0 in the phenol resin (A) is not particularly limited, but it is preferably equal to or more than 25% by mass, and more preferably equal to or more than 35% by mass. When the content of the component with n=0 is within the above lower limit, blocking of the phenol resin alone is hardly caused, and the resin composition for encapsulating a semiconductor using the phenol resin (A) may exhibit excellent flow properties, fixation resistance and low water absorption. In order to have the content of the component with n=0 in the aforementioned preferable range, the content may be adjusted according to the method to be described below.

Incidentally, in a method of increasing high-temperature storage characteristics and solder resistance by the use of a conventional epoxy resin having a naphthalene skeleton in combination with a phenol resin curing agent having a naphthalene skeleton as described in Reference Document 1, when the flowability is lowered due to high viscosity, or the viscosity is reduced, there are problems such that the resin compositions in a standby state in a molding machine (25 to 30 degrees centigrade) are fixed to each other, and defective transfer thus occurs.

On the other hand, the resin composition for encapsulating a semiconductor using the phenol resin (A) of the present invention is excellent in a balance between flowability and fixation resistance.

R1s in the phenol resin (A) represented by the general formula (1) are each a hydrocarbon group having 1 to 60 carbon atoms, and may be the same or different from each other. When the number of carbon atoms is equal to or less than 60, the melt viscosity of the resin composition for encapsulating a semiconductor becomes low, so that the flowability may be improved. a represents the number of substituent R1s bonded on the same naphthalene ring, and as are each independently an integer of 0 to 5 and more preferably an integer of 0 to 3. b represents the number of substituent R1s bonded on a benzene ring, and b is each independently an integer of 0 to 4 and more preferably an integer of 0 to 2.

R1 in the general formula (1) is not particularly limited as long as the number of carbon atoms is from 1 to 60. Examples include a methyl group, an ethyl group, a propyl group, an n-butyl group, an isobutyl group, a t-butyl group, an n-pentyl group, a 2-methylbutyl group, a 3-methylbutyl group, a t-pentyl group, an n-hexyl group, a 1-methylpentyl group, a 2-methylpentyl group, a 3-methylpentyl group, a 4-methylpentyl group, a 2,2-dimethylbutyl group, a 2,3-dimethylbutyl group, a 2,4-dimethylbutyl group, a 3,3-dimethylbutyl group, a 3,4-dimethylbutyl group, a 4,4-dimethylbutyl group, a 2-ethylbutyl group, a 1-ethylbutyl group, a cyclohexyl group, a phenyl group, a benzyl group, a methylbenzyl group, an ethylbenzyl group, a naphthyl group, a biphenyl group and the like. R1 may be one of these hydrocarbon groups repeatedly bonded to each other or two or more hydrocarbon groups bonded to each other. Preferably used are hydrocarbon groups having an aromatic ring structure, such as a phenyl group, a benzyl group, a methylbenzyl group, an ethylbenzyl group, a naphthyl group, a biphenyl group and the like, while more preferably used area benzyl group, a methylbenzyl group and an ethylbenzyl group corresponding to the group represented by the following general formula (2). It is preferable that the substituent R1 is a group having an aromatic ring structure from the viewpoint of improvement of moisture resistance of the resin composition for encapsulating a semiconductor. Furthermore, it is preferable that the substituent R1 has a structure of the general formula (2) from the viewpoint of introduction of the substituent at relatively low cost. The bonding position of the substituent R1 is not particularly limited, but the substituent R1 is preferably bonded to a carbon atom on a naphthalene ring because an autoxidation phenomenon of a hydroxyl group is suppressed and storage stability is increased.

[Chemical Formula 4]

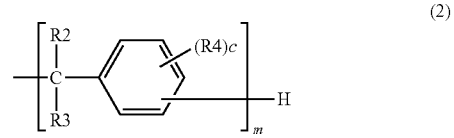

(2)

In the general formula (2), R2 and R3 are each independently a hydrogen atom or a hydrocarbon group having 1 to 3 carbon atoms; R4 is each independently a hydrocarbon group having 1 to 3 carbon atoms which is bonded on any position on a benzene ring; c is an integer of 0 to 4; and the number m of repeating units is an integer of 1 to 5. More preferably, c is an integer of 0 to 3. More preferably, m is an integer of 1 to 3. Here, the total number of m of the general formula (2) in the above general formula (1) is preferably an integer of 1 to 5 and more preferably an integer of 1 to 3.

The content of the component that is a group represented by the general formula (2) in the phenol resin (A) is not particularly limited, but in the area conversion method according to the gel permeation chromatography (GPC) measurement to be described below, the upper limit of the content is preferably equal to or less than 80% by area, and more preferably equal to or less than 65% by area, based on the total phenol resin (A). When the content is within the above upper limit, a resin composition for a semiconductor excellent in reactivity with an epoxy resin and flowability can be obtained. The lower limit is preferably equal to or more than 20% by area, and more preferably equal to or more than 40% by area. When the content is within the above lower limit, moisture resistance and storage stability are excellent.

The proportion of the component in which R1 is a group represented by the general formula (2) based on the total phenol resin (A) may be calculated, for example, in the following manner.

When the phenol resin (A) is subjected to gel permeation chromatography (GPC) measurement, the molecular weights of respective components corresponding to the detected peaks are determined in terms of polystyrene, and the contents of respective components corresponding to the peaks detected from the ratio of the detected peak areas are calculated.

The structure of each peak in a chart obtained by GPC measurement may be confirmed by NMR analysis or FD-MS analysis after the separation into respective fractions.

In the present invention, gel permeation chromatography (GPC) was measured in the following manner. A GPC device was equipped with a pump, an injector, a guard column, a column and a detector. Tetrahydrofuran (THF) was used as a solvent for the measurement. The flow rate of the pump was 0.5 ml/min. A plurality of commercial guard columns (for example, TSK GUARDCOLUMN HHR-L, commercially available from Tosoh Corporation, diameter: 6.0 mm, pipe length: 40 mm) as a guard column and a plurality of commercial polystyrene gel columns (TSK-GEL GMHHR-L, commercially available from Tosoh Corporation, diameter: 7.8 mm, pipe length: 30 mm) as a column were serially connected. A differential refractometer (RI detector, for example, differential refractive index (RI) detector, W2414, commercially available from Waters Corporation) was used as a detector. Before the measurement, the inside of the guard column, column and detector was stabilized at a temperature of 40 degrees centigrade. A THF solution of the phenol resin in which its concentration was adjusted to 3 to 4 mg/ml was prepared as a sample and the solution was injected from an injector of about 50 to 150 μl for the measurement. For the analysis of the sample, a calibration curve produced by the use of a monodispersed polystyrene (hereinafter referred to as PS) standard sample was used. The calibration curve was obtained by plotting the logarithmic value of the PS molecular weight versus the peak detection time (retention time) of PS, and making a straight line using a regression equation. As the standard PS sample for producing a calibration curve, there were used Model S-1.0 (peak molecular weight: 1,060), S-1.3 (peak molecular weight: 1,310), S-2.0 (peak molecular weight: 1,990), S-3.0 (peak molecular weight: 2,970), S-4.5 (peak molecular weight: 4,490), S-5.0 (peak molecular weight: 5,030), S-6.9 (peak molecular weight: 6,930), S-11 (peak molecular weight: 10,700) and S-20 (peak molecular weight: 19,900), all of which were Shodex standard SL-105 series commercially available from Showa Denko K.K.

The phenol resin (A) used in the resin composition for encapsulating a semiconductor of the present invention can be obtained, for example, by reacting a biphenylene compound represented by the following general formula (3) with a naphthalenediol compound represented by the following general formula (4) under an acid catalyst. When R1 has a structure represented by the general formula (2), substituents may be introduced in a benzyl compound represented by the following general formula (5) or (6) using an acid catalyst during or after the reaction of the phenol resin.

[Chemical Formula 5]

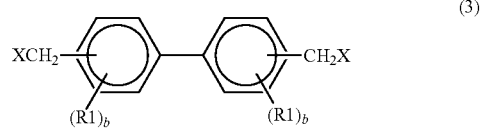

(3)

In the formula, X represents a hydroxyl group, a halogen atom or an alkoxy group having 1 to 4 carbon atoms; R1 is each independently a hydrocarbon group having 1 to 60 carbon atoms; and b is each independently an integer of 0 to 4. Herein, R1 and b in the general formula (3) are the same as those defined in the above general formula (1),

[Chemical Formula 6]

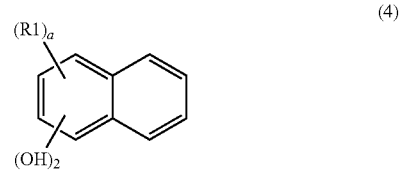

(4)

In the formula, two hydroxyl groups bonded to the same naphthalene group are bonded to different carbon atoms on a naphthalene ring; R1 is each independently a hydrocarbon group having 1 to 60 carbon atoms; and as are each independently an integer of 0 to 5. Herein, R1 and a in the general formula (4) are the same as those defined in the above general formula (1).

[Chemical Formula 7]

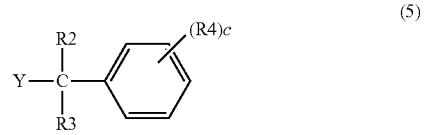

(5)

In the formula, Y is not particularly limited as long as it is a substituent reactive to a naphthalene ring, and Y represents a hydroxyl group, a halogen atom or an alkoxy group having 1 to 4 carbon atoms; R2 and R3 are each independently a hydrogen atom or a hydrocarbon group having 1 to 3 carbon atoms; R4 is each independently a hydrocarbon group having 1 to 3 carbon atoms; and c is each independently an integer of 0 to 4. Herein, R2, R3, R4 and c in the general formula (5) are the same as those defined in the above general formula (2).

[Chemical Formula 8]

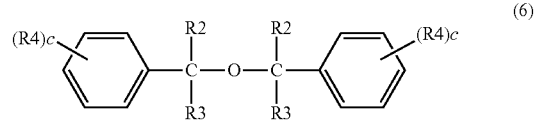

(6)

In the formula, R2 and R3 are each independently a hydrogen atom or a hydrocarbon group having 1 to 3 carbon atoms;

R4 is each independently a hydrocarbon group having 1 to 3 carbon atoms; and c is each independently an integer of 0 to 4. Herein, R2, R3, R4 and c in the general formula (6) are the same as those defined in the above general formula (2).

The biphenylene compound used for a raw material of the phenol resin (A) is not particularly limited as long as it has a chemical structure represented by the general formula (3). Examples thereof include 4,4'-bischloromethylbiphenyl, 4,4'-bisbromomethylbiphenyl, 4,4'-bisiodomethylbiphenyl, 4,4'-bishydroxymethylbiphenyl, 4,4'-bismethoxymethylbiphenyl, 3,3',5,5'-tetramethyl-4,4'-bischloromethylbiphenyl, 3,3',5,5'-tetramethyl-4,4'-bisbromomethylbiphenyl, 3,3',5,5'-tetramethyl-4,4'-bisiodomethylbiphenyl, 3,3',5,5'-tetramethyl-4,4'-bishydroxymethylbiphenyl, 3,3',5,5'-tetramethyl-4,4'-bismethoxymethylbiphenyl and the like. These compounds may be used singly or may be used in combination of two or more kinds.

Among these compounds, preferably used is 4,4'-bismethoxymethylbiphenyl from the viewpoint of easy availability, while preferably used is 4,4'-bischloromethylbiphenyl from the fact that a polymerization catalyst is reduced and impurities are reduced.

When X is a halogen atom, hydrogen halide by-produced during the reaction acts as an acid catalyst, so that there is no need to add an acid catalyst during the reaction, and the reaction may initiate promptly with the addition of a small amount of water.

The dihydroxynaphthalene compound used for a raw material of the phenol resin (A) is not particularly limited as long as it has a chemical structure represented by the general formula (4). Preferably used is a dihydroxynaphthalene compound in which the bonding position of two hydroxyl groups is not adjacent on the naphthalene skeleton. When the bonding position of the hydroxyl groups is not adjacent, a resin composition for a semiconductor may exhibit excellent curability and strength. Concrete examples of the dihydroxynaphthalene compound in which the bonding position of the hydroxyl groups is not adjacent include 2,7-dihydroxynaphthalene, 1,5-dihydroxynaphthalene, 1,4-dihydroxynaphthalene, 2,6-dihydroxynaphthalene, 1,6-dihydroxynaphthalene and the like. These compounds may be used singly or may be used in combination of two or more kinds.

Among these compounds, preferably used is 1,6-dihydroxynaphthalene because the softening point of the obtained phenol resin is relatively low and melt-kneading with an epoxy resin is easy.

The compound represented by the general formula (5) used for the production of the phenol resin (A) is not particularly limited, and examples thereof include benzyl alcohol, benzyl chloride, benzyl bromide, benzyl methyl ether, benzyl ethyl ether, methylbenzyl chloride, ethylbenzyl chloride, isopropylbenzyl chloride, 2-phenyl-2-chloropropane and 1-phenylethyl chloride. These compounds may be used singly or may be used in combination of two or more kinds.

Among these compounds, preferably used are benzyl chloride and benzyl bromide because an acid catalyst may not be used together.

The compound represented by the general formula (6) used for the production of the phenol resin (A) is not particularly limited, and examples include dibenzyl ether, di(methylbenzyl)ether, di(ethylbenzyl)ether, di(isopropylbenzyl)ether and the like. These compounds may be used singly, may be used in combination of two or more kinds, or may be used together with the compound represented by the general formula (5).

The acid catalyst used when a biphenylene compound represented by the general formula (3) is reacted with a naphthalenediol compound represented by the general formula (4) is not particularly limited. Examples thereof include formic acid, oxalic acid, p-toluenesulfonic acid, hydrochloric acid, sulfuric acid, phosphoric acid, acetic acid, Lewis acid and the like.

A method for synthesizing the phenol resin (A) used for the present invention is not particularly limited. For example, 0.1 to 0.8 mole of the total amount of the biphenylene compound, 0 to 2 mole of the benzyl compound, and 0.01 to 0.05 mole of the acid catalyst, based on 1 mole of the above-described dihydroxynaphthalene compound, are reacted at a temperature of 80 to 170 degrees centigrade for 1 to 20 hours, while discharging generated gas and moisture out of the system by nitrogen flow, and unreacted monomers (for example, a benzyl compound or a dihydroxynaphthalene compound) remained after completion of the reaction, reaction by-products (for example, hydrogen halide, moisture, methanol) and a catalyst may be distilled off by a method such as vacuum distillation, steam distillation or the like.

The mixture is reacted at 80 to 170 degrees centigrade for 1 to 20 hours with the addition of the benzyl compound and the above-described acid catalyst to the previously synthesized phenol resin while discharging generated gas and moisture out of the system by nitrogen flow, and then remained unreacted monomers (for example, a benzyl compound or a dihydroxynaphthalene compound) and reaction by-products (for example, hydrogen halide, moisture, methanol) may be distilled off by a method such as vacuum distillation, steam distillation or the like.

When X in the biphenylene compound or Y in the benzyl compound is a halogen atom, acid gas generated without the use of the acid catalyst by the addition of some water to the reaction system is used as a catalyst, whereby the phenol resin (A) can be obtained.

The synthesis method to control the content of the component with n=0 in the phenol resin (A) is not particularly limited, but the content may be controlled, for example, in the above synthesis method, by adjusting the mixing amount of an acid catalyst, changing the ratio of the dihydroxynaphthalene compound and the biphenylene compound to be introduced, adjusting the reaction temperature, sequentially adding the dihydroxynaphthalene compound during the reaction or the like.

Specifically, in order to increase the ratio of the component with n=0 in the phenol resin (A), the mixing amount of an acid catalyst is reduced, the ratio of the dihydroxynaphthalene compound and the biphenylene compound to be introduced is increased, the reaction temperature is lowered, the dihydroxynaphthalene compound is sequentially added during the reaction, or the like. Or, even when the dihydroxynaphthalene compound is added to the phenol resin after the reaction, the dihydroxynaphthalene compound may be combined at the time of mixing of the resin composition. In this case, the dihydroxynaphthalene compound is regarded as the n=0 component of the phenol resin (A).

A method of controlling the ratio of the phenol resin (A) having a structure of the general formula (2) contained in the phenol resin (A) is not particularly limited, but the ratio of the phenol resin (A) having a structural unit represented by the formula (2) may be controlled, for example, by changing the mixing amount of the acid catalyst to react the phenol resin with the benzyl compound, controlling the ratio of the phenol compound and the benzyl compound to be introduced, changing the reaction temperature, or the like.

Specifically, as a method of increasing the ratio of the phenol resin (A) having a structure of the general formula (2) contained in the phenol resin (A), the ratio of the phenol resin (A) having a structural unit represented by the formula (2)

may be enhanced by increasing the mixing amount of the acid catalyst, lowering the ratio of the phenol compound and the benzyl compound to be introduced, increasing the reaction temperature, or the like.

Incidentally, with the use of this method, the mean value of n of the phenol resin (A) is also lowered in some cases. A method of maintaining the mean value of n to a predetermined value is not particularly limited, but, for example, the benzyl compound is sequentially added to the system from the middle to the end of the synthesis reaction of the phenol resin (A).

In the resin composition for encapsulating a semiconductor of the present invention, other curing agent may be used together in the ranges in which an effect by the use of the above phenol resin (A) is not impaired.

The curing agent which may be used together is not particularly limited, and examples include a polyaddition type curing agent, a catalyst type curing agent, a condensation type curing agent and the like.

Examples of the polyaddition type curing agent include polyamine compounds containing dicyandiamide, organic dihydrazide and the like; acid anhydrides containing alicyclic acid anhydride such as hexahydrophthalic anhydride, methyl tetrahydrophthalic anhydride and the like, aromatic acid anhydride such as trimellitic anhydride, pyromellitic anhydride, benzophenonetetracarboxylic acid and the like; polyphenol compounds such as a novolac type phenol resin, a phenol polymer and the like; polymercaptan compounds such as polysulfide, thioester, thioether and the like; isocyanate compounds such as isocyanate prepolymer, blocked isocyanate and the like; and organic acids such as a carboxylic acid-containing polyester resin and the like, in addition to aliphatic polyamines such as diethylenetriamine, triethylenetetramine, meta-xylylene diamine and the like, and aromatic polyamines such as diaminodiphenyl methane, m-phenylenediamine, diaminodiphenyl sulfone and the like.

Examples of the catalyst type curing agent include tertiary amine compounds such as benzyldimethylamine, 2,4,6-tris-dimethylaminomethylphenol and the like; imidazole compounds such as 2-methylimidazole, 2-ethyl-4-methylimidazole and the like; and Lewis acids such as BF3 complex and the like.

Examples of the condensation type curing agent include phenol resin type curing agents such as a novolac type phenol resin, a resol type phenol resin and the like; urea resins such as methylol group-containing urea resins; and melamine resins such as methylol group-containing melamine resins.

Among these, preferably used is a phenol resin type curing agent from the viewpoint of a balance among flame resistance, moisture resistance, electrical properties, curability, storage stability and the like. The phenol resin type curing agent may generally be monomers, oligomers, or polymers having two or more phenolic hydroxyl groups in one molecule. The molecular weight and molecular structure thereof are not particularly restricted, and examples include novolac type resins such as a phenol novolac resin, a cresol novolac resin, a naphthol novolac resin and the like; polyfunctional phenol resins such as a triphenolmethane type phenol resin and the like; modified phenol resins such as a terpene-modified phenol resin, a dicyclopentadiene-modified phenol resin and the like; aralkyl type resins such as a phenol aralkyl resin having a phenylene skeleton and/or a biphenylene skeleton, a naphthol aralkyl resin having a phenylene skeleton and/or a biphenylene skeleton and the like; and bisphenol compounds such as bisphenol A, bisphenol F and the like. These may be used singly or may be used in combination of two or more kinds. Among these, the hydroxyl equivalent is preferably equal to or more than 90 g/eq and equal to or less than 250 g/eq from the viewpoint of curability.

When the other curing agent is used together, the lower limit of the mixing ratio of the phenol resin (A) is preferably equal to or more than 15% by mass, more preferably equal to or more than 25% by mass, and particularly preferably equal to or more than 35% by mass, based on the total curing agent. On the other hand, the upper limit of the mixing ratio of the phenol resin (A) is preferably equal to or less than 100% by mass, more preferably equal to or less than 100% by mass, and particularly preferably equal to or less than 100% by mass, based on the total curing agent. When the mixing ratio is within the above range, an effect of improving flame resistance and solder resistance while maintaining excellent flowability and curability may be achieved.

The lower limit of the mixing ratio of the total curing agent is not particularly limited, but it is preferably equal to or more than 0.8% by mass and more preferably equal to or more than 1.5% by mass, based on the total resin composition for encapsulating a semiconductor. When the lower limit of the mixing ratio is within the above range, sufficient flowability may be achieved. On the other hand, the upper limit of the mixing ratio of the total curing agent is not particularly limited, but it is preferably equal to or less than 10% by mass and more preferably equal to or less than 8% by mass, based on the total resin composition for encapsulating a semiconductor. When the upper limit of the mixing ratio is within the above range, excellent solder resistance may be achieved.

Examples of the epoxy resin used for the resin composition for encapsulating a semiconductor of the present invention include crystalline epoxy resins such as a biphenyl type epoxy resin, a bisphenol type epoxy resin, a stilbene type epoxy resin and the like; novolac type epoxy resins such as a phenol novolac type epoxy resin, a cresol novolac type epoxy resin and the like; polyfunctional epoxy resins such as a triphenolmethane type epoxy resin, an alkyl-modified triphenolmethane type epoxy resin and the like; aralkyl type epoxy resins such as a phenol aralkyl type epoxy resin having a phenylene skeleton, a phenol aralkyl type epoxy resin having a biphenylene skeleton and the like; naphthol type epoxy resins such as a dihydroxynaphthalene type epoxy resin, an epoxy resin obtained by glycidyl etherification of dimers of dihydroxynaphthalene and the like; triazine nucleus-containing epoxy resins such as triglycidyl isocyanurate, monoallyl diglycidyl isocyanurate and the like; and bridged cyclic hydrocarbon compound-modified phenol type epoxy resins such as a dicyclopentadiene-modified phenol type epoxy resin and the like, but are not restricted thereto. Epoxy resins such as aralkyl type epoxy resins such as a phenol aralkyl type epoxy resin having a phenylene skeleton, a phenol aralkyl type epoxy having a biphenylene skeleton and the like are preferable in view of an excellent balance among solder resistance, flame resistance and continuous molding property, while crystalline epoxy resins are preferable in view of excellent flowability. Furthermore, in view of moisture resistance reliability of the resulting resin composition for encapsulating a semiconductor, Na ion and Cl ion, which are ionic impurities, are preferably not contained in these epoxy resins as much as possible. Also, from the viewpoint of the curability of the resin composition for a semiconductor, the epoxy equivalent of the epoxy resin is preferably equal to or more than 100 g/eq and equal to or less than 500 g/eq.

The mixing amount of the epoxy resin in the resin composition for encapsulating a semiconductor is preferably equal to or more than 2% by mass, and more preferably equal to or more than 4% by mass, based on the total mass of the resin composition for encapsulating a semiconductor. When the lower limit is within the above range, the obtained resin composition has excellent flowability. On the other hand, the amount of the epoxy resin in the resin composition for encapsulating a semiconductor is preferably equal to or less than 15% by mass, and more preferably equal to or less than 13% by mass, based on the total mass of the resin composition for encapsulating a semiconductor. When the upper limit is within the above range, the obtained resin composition has excellent solder resistance.

Incidentally, it is preferable that the phenol resin and the epoxy resin are mixed such that the equivalent ratio (EP)/(OH) of the number of epoxy groups (EP) of the total epoxy resin to the number of phenolic hydroxyl groups (OH) of the total phenol resin is equal to or more than 0.8 and equal to or less than 1.3. When the equivalent ratio is within the above range, sufficient curing properties may be obtained during molding of the obtained resin composition.

The inorganic filler used for the resin composition for encapsulating a semiconductor of the present invention is not particularly limited, but inorganic fillers which are generally used in the related field may be used. Examples thereof include fused silica, spherical silica, crystalline silica, alumina, silicon nitride, aluminum nitride and the like.

The particle diameter of the inorganic filler is preferably equal to or more than 0.01 µm and equal to or less than 150 µm from the viewpoint of filling properties into the mold cavity.

The content of the inorganic filler is not particularly limited, but it is preferably equal to or more than 80% by mass, more preferably equal to or more than 83% by mass, and further preferably equal to or more than 86% by mass, based on the total mass of the resin composition for encapsulating a semiconductor. When the lower limit is within the above range, the amount of moisture absorption of a cured product of the obtained resin composition for encapsulating a semiconductor may be suppressed and deterioration of strength may be lowered, and accordingly a cured product having excellent soldering crack resistance may be obtained. Furthermore, the upper limit of the inorganic filler in the resin composition for encapsulating a semiconductor is preferably equal to or less than 93% by mass, more preferably equal to or less than 91% by mass, and further preferably equal to or less than 90% by mass, based on the total mass of the resin composition for encapsulating a semiconductor. When the upper limit is within the above range, the obtained resin composition has both excellent flowability and excellent moldability.

Incidentally, as described below, when metal hydroxide such as aluminum hydroxide, magnesium hydroxide or the like, or an inorganic flame retardant such as zinc borate, zinc molybdate, antimony trioxide or the like is used, the total amount of the inorganic flame retardant and the above-stated inorganic filler is preferably within the above range.

The resin composition for encapsulating a semiconductor of the present invention may further contain at least one compound (D) selected from the group consisting of a tetra-substituted phosphonium compound, a phosphobetaine compound, an adduct of a phosphine compound and a quinone compound, and an adduct of a phosphonium compound and a silane compound. The compound (D) has an action of accelerating a crosslinking reaction between an epoxy resin and a curing agent, and in addition thereto controlling a balance between flowability and curability during curing of the resin composition for encapsulating a semiconductor, and changing curing properties of the cured product. Concrete examples of the compound (D) include phosphorous-containing curing accelerators such as organic phosphine, a tetra-substituted phosphonium compound, a phosphobetaine compound, an adduct of a phosphine compound and a quinone compound, an adduct of a phosphonium compound and a silane compound, and the like; and compounds such as 1,8-diazabicyclo (5,4,0)undecene-7, benzyldimethylamine, 2-methylimidazole and the like. Among these compounds, preferably used are phosphorous-containing curing accelerators in view of curability. In view of a balance between flowability and curability, more preferably used are phosphorous-containing curing accelerators having latency such as a tetra-substituted phosphonium compound, a phosphobetaine compound, an adduct of a phosphine compound and a quinone compound, an adduct of a phosphonium compound and a silane compound, and the like. In viewpoint of flowability, particularly preferably used is a tetra-substituted phosphonium compound. In viewpoint of low elastic modulus during heating of a cured product of the resin composition for encapsulating a semiconductor, particularly preferably used are a phosphobetaine compound, and an adduct of a phosphine compound and a quinone compound. Furthermore, in viewpoint of the latent curability, particularly preferably used is an adduct of a phosphonium compound and a silane compound.

Examples of the organic phosphine which may be used for the resin composition for encapsulating a semiconductor of the present invention include primary phosphines such as ethylphosphine, phenylphosphine and the like; secondary phosphines such as dimethylphosphine, diphenylphosphine and the like; and tertiary phosphines such as trimethylphosphine, triethylphosphine, tributylphosphine, triphenylphosphine and the like.

Examples of the tetra-substituted phosphonium compound which may be used for the resin composition for encapsulating a semiconductor of the present invention include compounds represented by the following general formula (7).

[Chemical Formula 9]

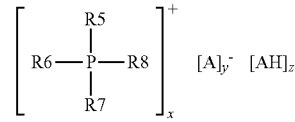

(7)

In the above general formula (7), P represents a phosphorus atom; R5, R6, R7 and R8 each independently represent an aromatic group or an alkyl group; A represents an anion of an aromatic organic acid in which at least one functional group selected from a hydroxyl group, a carboxyl group and a thiol group is bonded to an aromatic ring; AH represents an aromatic organic acid in which at least one functional group selected from a hydroxyl group, a carboxyl group and a thiol group is bonded to an aromatic ring; x and y are each an integer of 1 to 3; z is an integer of 0 to 3; and x=y.

The compound represented by the general formula (7) is obtained, for example, in the following manner, but the method is not restricted thereto. First, a tetra-substituted phosphonium halide, an aromatic organic acid and a base are added to an organic solvent and uniformly mixed to produce an aromatic organic acid anion in the solution system. Subsequently, water is added to the solution, and thus the compound represented by the general formula (7) may be precipitated. In the compound represented by the general formula (7), each of R5, R6, R7 and R8 bonded to a phosphorus atom is preferably a phenyl group, AH is preferably a compound having a hydroxyl group on its aromatic ring, that is, phenols, and A is preferably an anion of the phenols.

Examples of the phosphobetaine compound which may be used for the resin composition for encapsulating a semiconductor of the present invention include compounds represented by the following general formula (8).

[Chemical Formula 10]

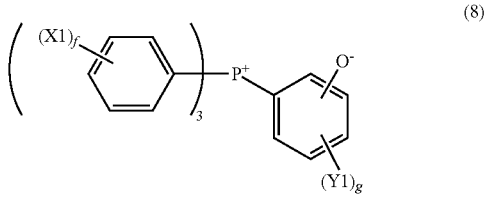

(8)

In the above general formula (8), X1 represents an alkyl group having 1 to 3 carbon atoms; Y1 represents a hydroxyl group; f is an integer of 0 to 5; and g is an integer of 0 to 4.

The compound represented by the general formula (8) is obtained, for example, in the following manner. First, it is obtained through a step in which a triaromatic-substituted phosphine, which is a tertiary phosphine, is brought into contact with a diazonium salt to substitute the triaromatic-substituted phosphine and a diazonium group of the diazonium salt. However, the method is not limited to this.

Examples of the adduct of a phosphine compound and a quinone compound which may be used for the resin composition for encapsulating a semiconductor of the present invention include compounds represented by the following general formula (9).

[Chemical Formula 11]

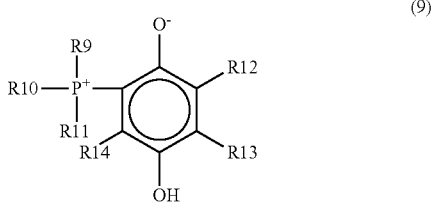

(9)

In the above general formula (9), P represents a phosphorus atom; R9, R10 and R11 each represent an alkyl group having 1 to 12 carbon atoms or an aryl group having 6 to 12 carbon atoms, which may be the same or different from each other; R12, R13 and R14 each represent a hydrogen atom or a hydrocarbon group having 1 to 12 carbon atoms, which may be the same or different from each other; and R12 and R13 may be bonded to each other to form a cyclic structure.

Preferable examples of the phosphine compound used for the adduct of a phosphine compound and a quinone compound include unsubstituted aromatic ring-containing phosphines such as triphenylphosphine, tris(alkylphenyl)phosphine, tris(alkoxyphenyl)phosphine, trinaphthylphosphine, tris(benzyl)phosphine and the like; and phosphines containing an aromatic ring substituted with an alkyl group or an alkoxy group. Examples of the alkyl group and the alkoxy group include alkyl groups having 1 to 6 carbon atoms and alkoxy groups having 1 to 6 carbon atoms. From the viewpoint of easy availability, triphenylphosphine is preferred.

Examples of the quinone compound used for the adduct of a phosphine compound and a quinone compound include o-benzoquinone, p-benzoquinone and anthraquinones.

Among these compounds, p-benzoquinone is preferred from the viewpoint of storage stability.

In a method for producing an adduct of a phosphine compound and a quinone compound, an organic tertiary phosphine is brought into contact with a benzoquinone in a solvent that can dissolve both the organic tertiary phosphine and the benzoquinone, and mixed to produce an adduct thereof. Any solvent can be used as long as the solubility into the adduct is low. Examples of the solvent include ketones such as acetone and methyl ethyl ketone, but are not limited thereto.

In the compound represented by the general formula (9), each of R9, R10 and R11, all of which are bonded to a phosphorus atom, is preferably a phenyl group, and each of R12, R13 and R14 is preferably a hydrogen atom. That is, a compound produced by adding 1,4-benzoquinone to triphenylphosphine is preferable, because the compound decreases the elastic modulus during heating of a cured product of the resin composition for encapsulating a semiconductor.

Examples of the adduct of a phosphonium compound and a silane compound which may be used for the resin composition for encapsulating a semiconductor of the present invention include compounds represented by the following general formula (10).

[Chemical Formula 12]

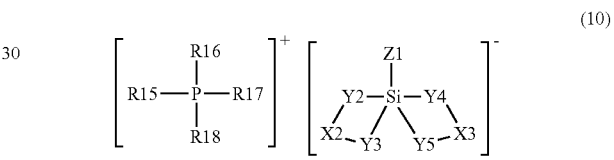

(10)

In the above general formula (10), P represents a phosphorus atom; Si represents a silicon atom; R15, R16, R17 and R18 each represent an organic group having an aromatic ring or a heterocyclic ring, or an aliphatic group, which may be the same or different from each other; X2 is an organic group that bonds group Y2 to group Y3; X3 is an organic group that bonds group Y4 to group Y5; Y2 and Y3 each represent a group formed when a proton-donating group releases a proton, and group Y2 and group Y3 in the same molecule are linked with the silicon atom to form a chelate structure; Y4 and Y5 each represent a group formed when a proton-donating group releases a proton, and group Y4 and group Y5 in the same molecule are linked with the silicon atom to form a chelate structure; X2 and X3 may be the same or different from each other; Y2, Y3, Y4 and Y5 may be the same or different from each other; and Z1 is an organic group having an aromatic ring or a heterocyclic ring, or an aliphatic group.

Examples of R15, R16, R17 and R18 in the general formula (10) include a phenyl group, a methylphenyl group, a methoxyphenyl group, a hydroxyphenyl group, a naphthyl group, a hydroxynaphthyl group, a benzyl group, a methyl group, an ethyl group, an n-butyl group, an n-octyl group, a cyclohexyl group and the like. Among these, more preferably used are aromatic groups having a substituent and unsubstituted aromatic groups such as a phenyl group, a methylphenyl group, a methoxyphenyl group, a hydroxyphenyl group, a hydroxynaphthyl group and the like.

Furthermore, in the general formula (10), X2 is an organic group that bonds group Y2 to group Y3. Similarly, X3 is an organic group that bonds group Y4 to group Y5. Y2 and Y3 are each a group formed when a proton-donating group releases a proton, and group Y2 and group Y3 in the same molecule are linked with the silicon atom to form a chelate structure. Similarly, Y4 and Y5 are each a group formed when a proton-donating group releases a proton, and group Y4 and group Y5 in the same molecule are linked with the silicon atom to form a chelate structure. The group X2 and group X3 may be the same or different from each other, and group Y2, group Y3, group Y4 and group Y5 may be the same or different from one another. The group represented by —Y2-X2-Y3- and the group represented by Y4-X3-Y5- in the general formula (10) are each a group formed when a proton donor releases two protons. Examples of the proton donor include catechol, pyrogallol, 1,2-dihydroxynaphthalene, 2,3-dihydroxynaphthalene, 2,2'-biphenol, 1,1'-bi-2-naphthol, salicylic acid, 1-hydroxy-2-naphthoic acid, 3-hydroxy-2-naphthoic acid, chloranilic acid, tannic acid, 2-hydroxybenzyl alcohol, 1,2-cyclohexanediol, 1,2-propanediol, glycerin and the like. Among these, more preferably used are catechol, 1,2-dihydroxynaphthalene and 2,3-dihydroxynaphthalene.

Furthermore, in the general formula (10), Z1 represents an organic group having an aromatic ring or a heterocyclic ring, or an aliphatic group. Specific examples of Z1 include aliphatic hydrocarbon groups such as a methyl group, an ethyl group, a propyl group, a butyl group, a hexyl group, an octyl group and the like; aromatic hydrocarbon groups such as a phenyl group, a benzyl group, a naphthyl group, a biphenyl group and the like; and reactive substituents such as a glycidyloxypropyl group, a mercaptopropyl group, an aminopropyl group, a vinyl group and the like. Among these, more preferably used are a methyl group, an ethyl group, a phenyl group, a naphthyl group and a biphenyl group from the viewpoint of thermal stability of the general formula (10).

In a method for producing an adduct of a phosphonium compound and a silane compound, a silane compound such as phenyltrimethoxysilane and a proton donor such as 2,3-dihydroxynaphthalene are added to methanol in a flask and dissolved. Next, a sodium methoxide-methanol solution is added dropwise thereto under stirring at room temperature. A solution prepared by dissolving a tetra-substituted phosphonium halide such as tetraphenyl phosphonium bromide in methanol in advance is added dropwise to the resulting reaction product under stirring at room temperature to precipitate crystals. The precipitated crystals are filtered, washed with water, and then dried in vacuum. Thus, an adduct of a phosphonium compound and a silane compound can be obtained. However, the method is not limited to this.

The mixing ratio of the compound (D) which may be used for the resin composition for encapsulating a semiconductor of the present invention is more preferably equal to or more than 0.1% by mass and equal to or less than 1% by mass, based on the total resin composition. When the mixing amount of the compound (D) is within the above range, sufficient curability and flowability may be achieved.

In the resin composition for encapsulating a semiconductor of the present invention, a compound (E) in which a hydroxyl group is bonded to each of two or more adjacent carbon atoms constituting an aromatic ring (hereinafter referred to as the compound (E)) may be further used. Even when a phosphorus-containing curing accelerator without having latency is used as the compound (D) for accelerating a crosslinking reaction between the phenol resin (A) and the epoxy resin, the reaction of the resin composition during the melt kneading may be suppressed with the use of the compound (E), so that a resin composition for encapsulating a semiconductor can be obtained stably.

Furthermore, the compound (E) also has an effect of decreasing the melt viscosity of the resin composition for encapsulating a semiconductor and increasing flowability.

Examples of the compound (E) include a monocyclic compound represented by the following general formula (11), a polycyclic compound represented by the following general formula (12) and the like, and these compounds may have a substituent other than a hydroxyl group,

[Chemical Formula 13]

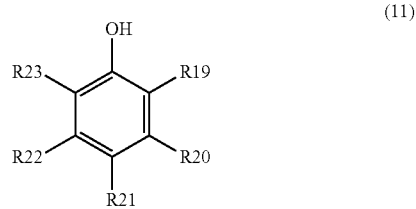

(11)

In the above general formula (11), either R19 or R23 is a hydroxyl group, when one of R19 and R23 is a hydroxyl group, the other is a hydrogen atom, a hydroxyl group or a substituent other than a hydroxyl group; and R20, R21 and R22 are each a hydrogen atom, a hydroxyl group or a substituent other than a hydroxyl group,

[Chemical Formula 14]

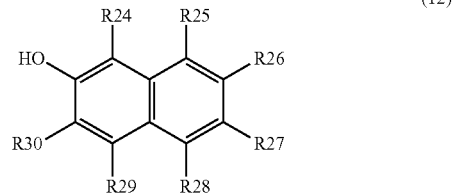

(12)

In the above general formula (12), either R24 or R30 is a hydroxyl group, when one of R24 and R30 is a hydroxyl group, the other is a hydrogen atom, a hydroxyl group or a substituent other than a hydroxyl group; and R25, R26, R27, R28 and R29 are each a hydrogen atom, a hydroxyl group or a substituent other than a hydroxyl group.

Examples of the monocyclic compound represented by the general formula (11) include catechol, pyrogallol, gallic acid, gallic acid esters and their derivatives. Examples of the polycyclic compound represented by the general formula (12) include 1,2-dihydroxynaphthalene, 2,3-dihydroxynaphthalene and their derivatives. Among these compounds, from the viewpoint of ease of control of flowability and curability, preferably used is a compound in which a hydroxyl group is bonded to each of two adjacent carbon atoms constituting an aromatic ring. Furthermore, in viewpoint of volatilization in a step of kneading, more preferably used is a compound having, as a mother nucleus, a naphthalene ring, which has low volatility and high weighing stability. In this case, the compound (E) may be specifically, for example, a compound having a naphthalene ring such as 1,2-dihydroxynaphthalene, 2,3-dihydroxynaphthalene and their derivatives. These compounds (E) may be used singly or may be used in combination of two or more kinds.

The mixing amount of the compound (E) is equal to or more than 0.01% by mass and equal to or less than 1% by mass, more preferably equal to or more than 0.03% by mass and equal to or less than 0.8% by mass, and particularly preferably equal to or more than 0.05% by mass and equal to or less than 0.5% by mass, based on the total resin composition for encapsulating a semiconductor. When the lower limit of the mixing amount of the compound (E) is within the above range, the resin composition for encapsulating a semiconductor may achieve sufficient low viscosity and improvement of flowability. On the other hand, when the upper limit of the mixing amount of the compound (E) is within the above range, there is little risk of deteriorating curability and continuous molding property of the resin composition for encapsulating a semiconductor, or causing a crack at a solder reflow temperature.

Incidentally, some of the compounds (E) correspond to the phenol resin (A) represented by the general formula (1) in some cases.

In this case, among the compounds (E), a compound (E) corresponding to the phenol resin (A) is added to the phenol resin (A), and the mixing amount of the phenol resin (A) is determined including the amount of the compound (E) added.

In the resin composition for encapsulating a semiconductor of the present invention, for the purpose of improving adhesion between the epoxy resin (B) and the inorganic filler (C), an adhesion auxiliary agent such as a silane coupling agent or the like may be added.

The coupling agent is not particularly limited, and examples thereof include epoxysilane, aminosilane, ureidosilane, mercaptosilane and the like, and it may be any one which can be reacted between an epoxy resin and an inorganic filler to improve the interfacial strength between the epoxy resin and the inorganic filler. Furthermore, when the silane coupling agent may be used together with the above-stated compound (E), the compound (E) reduces the melt viscosity of the resin composition and improves flowability by the synergic effect with the silane coupling agent.

Examples of the epoxysilane include γ-glycidoxypropyltriethoxysilane, γ-glycidoxypropyltrimethoxysilane, γ-glycidoxypropylmethyldimethoxysilane, β-(3,4-epoxycyclohexyl)ethyltrimethoxysilane and the like.

Examples of the aminosilane include γ-aminopropyltriethoxysilane, γ-aminopropyltrimethoxysilane, N-β(aminoethyl)γ-aminopropyltrimethoxysilane, N-β(aminoethyl)γ-aminopropylmethyldimethoxysilane, N-phenylγ-aminopropyltriethoxysilane, N-phenylγ-aminopropyltrimethoxysilane, N-β(aminoethyl)γ-aminopropyltriethoxysilane, N-6-(aminohexyl)-3-aminopropyltrimethoxysilane, N-(3-(trimethoxysilylpropyl)-1,3-benzenedimethanane and the like. Examples of the ureidosilane include γ-ureidopropyltriethoxysilane, hexamethyldisilazane and the like.

Examples of the mercaptosilane include γ-mercaptopropyltrimethoxysilane and the like. These silane coupling agents may be used singly or may be used in combination of two or more kinds.

The lower limit of the mixing ratio of the coupling agent which may be used for the resin composition for encapsulating a semiconductor of the present invention is preferably equal to or more than 0.01% by mass, more preferably equal to or more than 0.05% by mass, and particularly preferably equal to or more than 0.1% by mass, based on the total resin composition for encapsulating a semiconductor. When the lower limit of the mixing ratio of the coupling agent is within the above range, a semiconductor device excellent in soldering crack resistance can be obtained without lowering the interfacial strength between the epoxy resin and the inorganic filler. On the other hand, the upper limit of the mixing ratio of the coupling agent is preferably equal to or less than 1% by mass, more preferably equal to or less than 0.8% by mass, and particularly preferably equal to or less than 0.6% by mass, based on the total resin composition for encapsulating a semi-conductor. When the upper limit of the mixing ratio of the coupling agent is within the above range, a semiconductor device excellent in soldering crack resistance can be obtained without lowering the interfacial strength between the epoxy resin and the inorganic filler. Also, when the mixing ratio of the coupling agent is within the above range, a semiconductor device excellent in soldering crack resistance can be obtained without increasing water absorption of the cured product of the resin composition.

The resin composition for encapsulating a semiconductor of the present invention may further properly contain, in addition to the aforementioned components, an additive, for example, a coloring agent such as carbon black, bengala, titanium oxide or the like; a natural wax such as a carnauba wax or the like; a synthetic wax such as a polyethylene wax or the like; a releasing agent such as a higher fatty acid and metal salts thereof, for example, stearic acid, zinc stearate or the like, or paraffin; a low-stress additive such as silicone oil, silicone rubber or the like; an inorganic ion-exchanger such as bismuth oxide hydrate or the like; a metal hydroxide such as aluminum hydroxide, magnesium hydroxide or the like; and a flame retardant such as zinc borate, zinc molybdate, phosphazene, antimony trioxide or the like.

The resin composition for encapsulating a semiconductor of the present invention is prepared, for example, by homogeneously mixing the phenol resin (A), the epoxy resin (B), the inorganic filler (C), and the above-stated other additives at normal temperature using a mixer or the like.

Thereafter, as necessary, the homogenous mixture is melt-kneaded using a kneading machine such as a heating roller, a kneader or an extruder, and then the resulting mixture is cooled and pulverized as necessary. Desirable dispersibility and flowability may be achieved.

Next, the semiconductor device of the present invention will be described.

In a method for producing a semiconductor device using the resin composition for encapsulating a semiconductor of the present invention, for example, a lead frame or a circuit board on which a semiconductor element is mounted is placed in a mold cavity, and then the resin composition for encapsulating a semiconductor is molded by a molding method such as transfer molding, compression molding, injection molding or the like and is cured in the mold, whereby the semiconductor element is encapsulated.

Examples of the semiconductor element to be encapsulated include integrated circuits, large scale integrated circuits, transistors, thyristors, diodes, solid-state image sensing devices and the like, but are not restricted thereto.

Examples of the shape of the obtained semiconductor device include a dual in-line package (DIP), a plastic leaded chip carrier (PLCC), a quad flat package (QFP), a low-profile quad flat package (LQFP), a small outline package (SOP), a small outline J-leaded package (SOJ), a thin small outline package (TSOP), a thin quad flat package (TQFP), a tape carrier package (TCP), a ball grid array (BGA), a chip size package (CSP) and the like, but are not restricted thereto.

The semiconductor device in which a semiconductor element is encapsulated by a molding method such as transfer molding or the like of the resin composition for encapsulating a semiconductor may be mounted on any electronic device without curing or after completely curing the resin composition at a temperature of about 80 to 200 degrees centigrade over a period of about 10 minutes to 10 hours.

FIG. 1 is a view illustrating a cross-section structure of an example of a semiconductor device using a resin composition for encapsulating a semiconductor according to the present invention. A semiconductor element 1 is fixed on a die pad 3 through a cured die bond material 2. An electrode pad of the semiconductor element 1 and a lead frame 5 are connected by a gold wire 4. The semiconductor element 1 is encapsulated with a cured product 6 of the resin composition for encapsulating a semiconductor.

Figure 2:
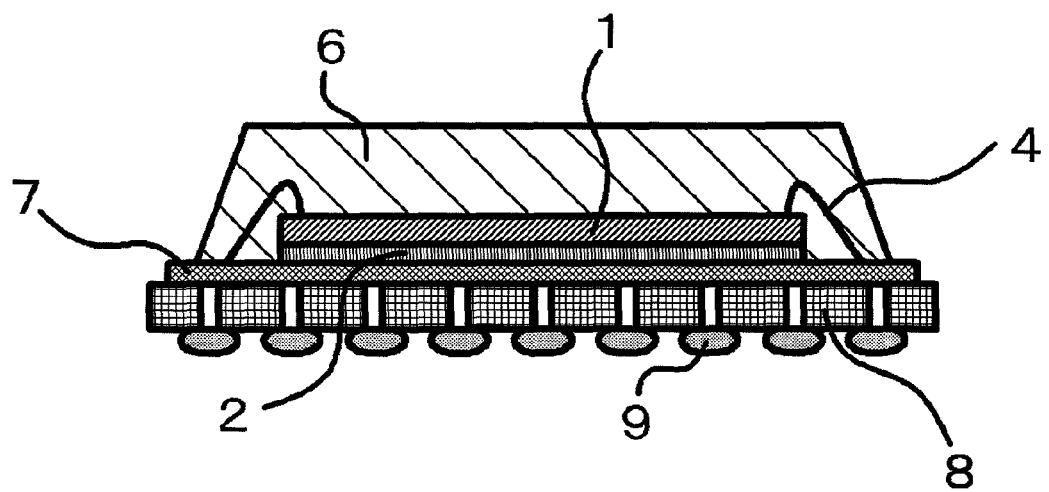
FIG. 2 is a view illustrating a cross-section structure of an example of a one-side encapsulated semiconductor device using a resin composition for encapsulating a semiconductor according to the present invention.

FIG. 2 is a view illustrating a cross-section structure of an example of a one-side encapsulated semiconductor device using a resin composition for encapsulating a semiconductor according to the present invention. A semiconductor element 1 is fixed on a surface of a substrate 8 through a cured die bond material 2 on a solder resist 7 of a laminate where a layer of the solder resist 7 is formed.

In order for electric conduction between the semiconductor element 1 and the substrate 8, the solder resist 7 on the electrode pad is eliminated by a developing method such that the electrode pad is exposed.

Accordingly, the semiconductor device in FIG. 2 is designed to connect the electrode pad of the semiconductor element 1 and the electrode pad on the substrate 8 by means of the gold wire 4.

The encapsulating resin composition is used for encapsulating a semiconductor device to form a cured product 6, whereby a semiconductor device in which only one side with the semiconductor element 1 of the substrate 8 mounted thereon is encapsulated can be obtained. The electrode pad on the substrate 8 is internally connected to a solder ball 9 provided on the non-encapsulated surface of the substrate 8.

EXAMPLES

Hereinafter, the present invention will be described in detail with reference to Examples. However, the present invention is not restricted to these Examples. In the following Examples, the mixing amount of each component is represented by "parts by mass" unless otherwise particularly noted.

The following phenol resins 1 to 3 were used for the phenol resin (A).

Figure 3:
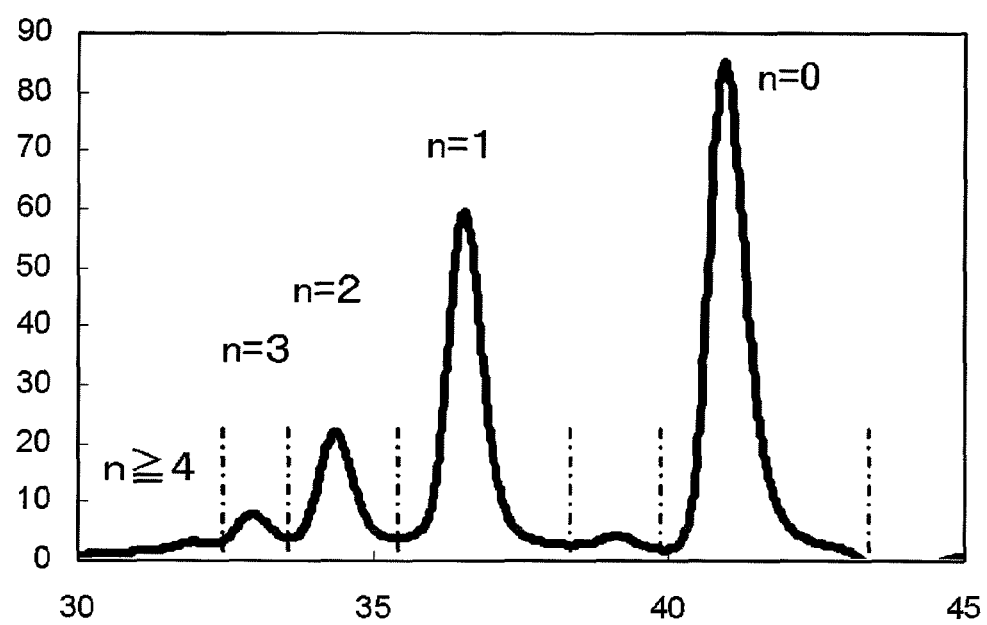
FIG. 3 is a GPC chart of a phenol resin 1 used in Examples and Comparative Examples.
Figure 4:
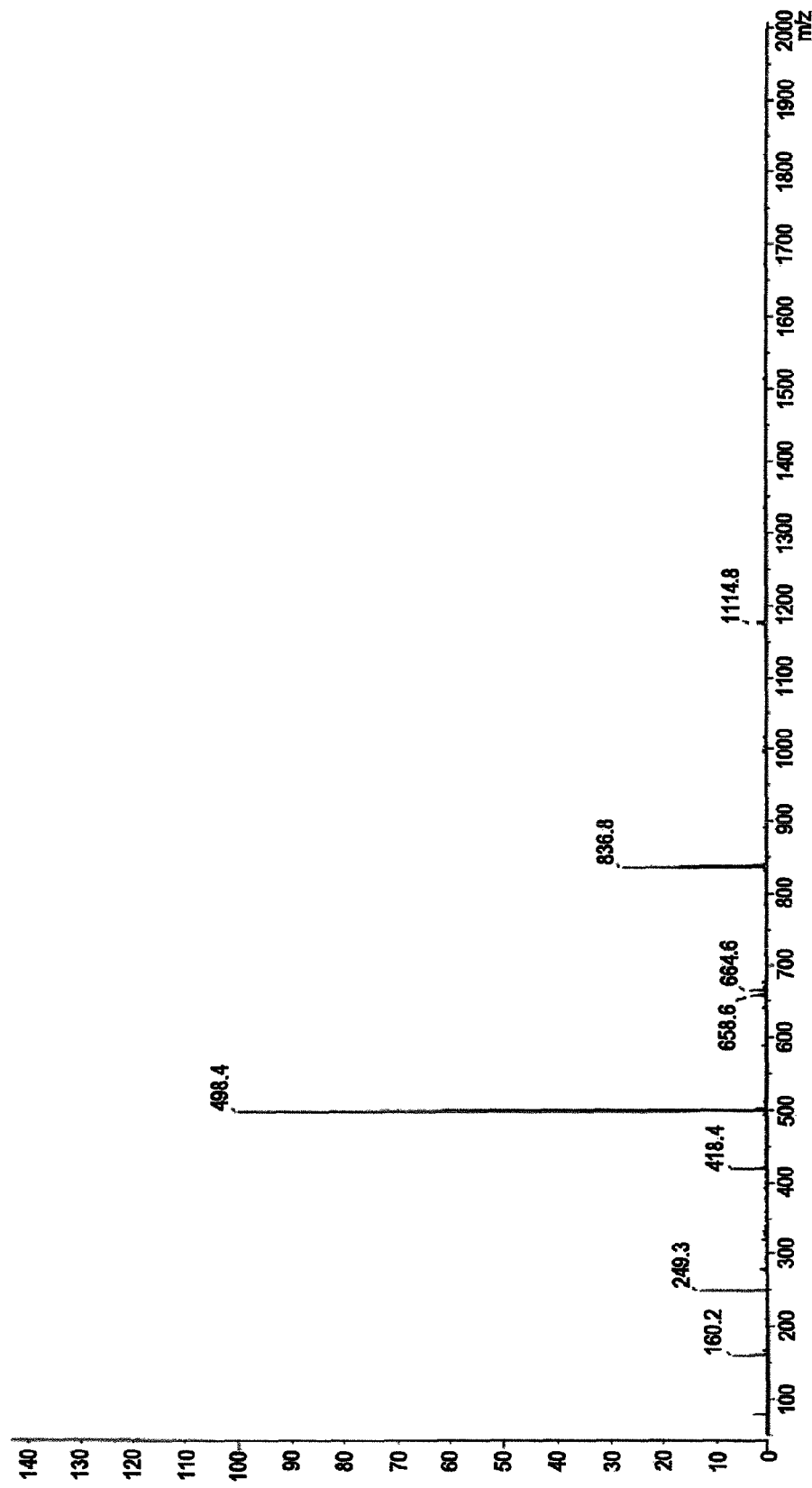
FIG. 4 is a FD-MS chart of a phenol resin 1 used in Examples and Comparative Examples.

Phenol resin 1: 100 parts by mass of 1,6-naphthalenediol (commercially available from Tokyo Chemical Industry, Co., Ltd., melting point: 136 degrees centigrade, molecular weight: 160.2, purity: 99.5%), 31.5 parts by mass of 4,4'-bischloromethylbiphenyl (commercially available from Wako Pure Chemical Industries, Ltd., purity: 97.5%, molecular weight: 251) and 0.6 parts by mass of pure water were weighed in a separable flask. While the flask was purged with nitrogen, the resulting mixture was heated and began to be stirred in association with initiation of melting. The reaction was carried out for 2 hours while maintaining the temperature in the system in the range of 150 to 160 degrees centigrade. During the above reaction, hydrochloric acid generated in the system by the reaction was discharged out of the system by nitrogen flow. After completion of the reaction, remained hydrochloric acid and moisture were removed under reduced-pressure condition of 2 mmHg at 150 degrees centigrade. A phenol resin 1 represented by the following formula (13) (hydroxyl equivalent: 102, softening point: 75 degrees centigrade, ICI viscosity at 150 degrees centigrade: 1.15 dPa·s, content of n=0 calculated by the area method of GPC: 51%, content of n=0 to 2: 95%, mean value of n: 0.72) was obtained. A GPC chart is illustrated in FIG. 3, while a FD-MS chart is illustrated in FIG. 4.

Figure 5:
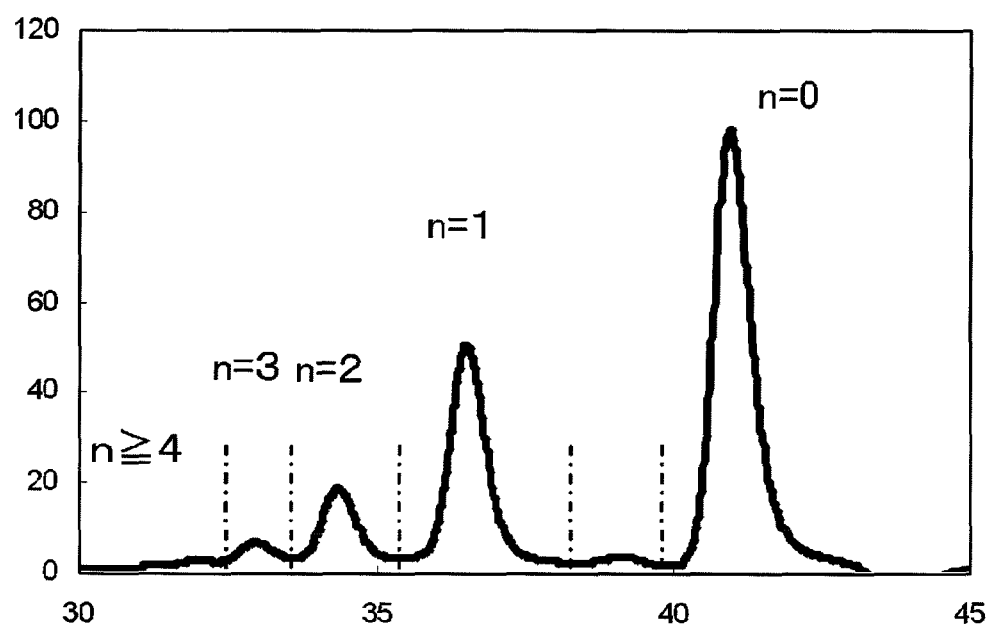
FIG. 5 is a GPC chart of a phenol resin 2 used in Examples and Comparative Examples.

Phenol resin 2: An operation was carried out in the same manner as in the phenol resin 1 using 115 parts by mass of 1,6-naphthalenediol in the synthesis of the phenol resin 1, whereby a phenol resin 2 represented by the following formula (13) (hydroxyl equivalent: 98, softening point: 84 degrees centigrade, ICI viscosity at 150 degrees centigrade: 0.9 dPa·s, content of n=0 calculated by the area method of GPC: 55%, content of n=0 to 2: 95%, mean value of n: 0.65) was obtained. A GPC chart is illustrated in FIG. 5.

Figure 6:
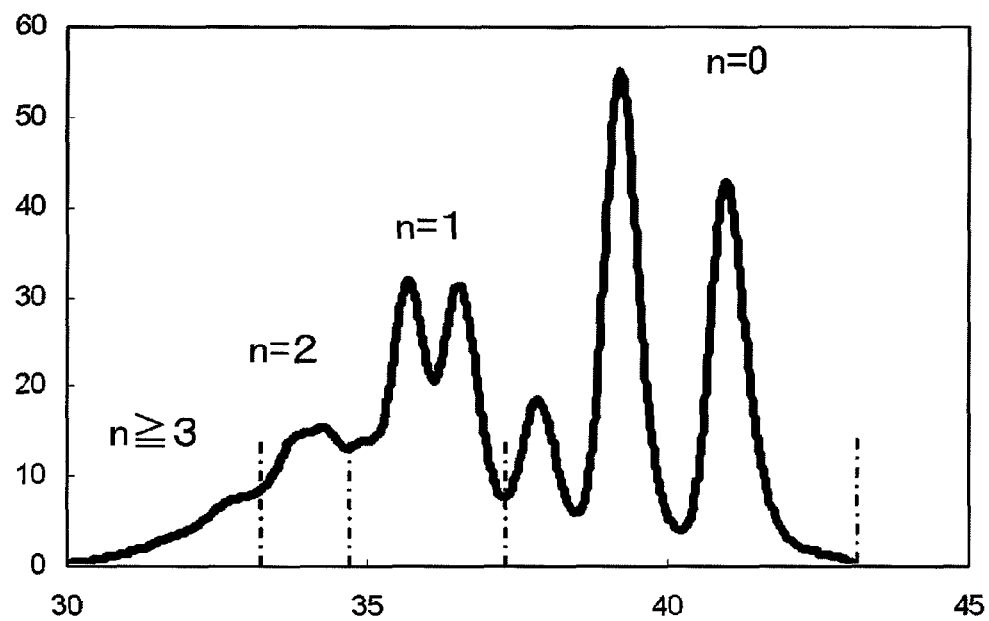
FIG. 6 is a GPC chart of a phenol resin 3 used in Examples and Comparative Examples.
Figure 7:
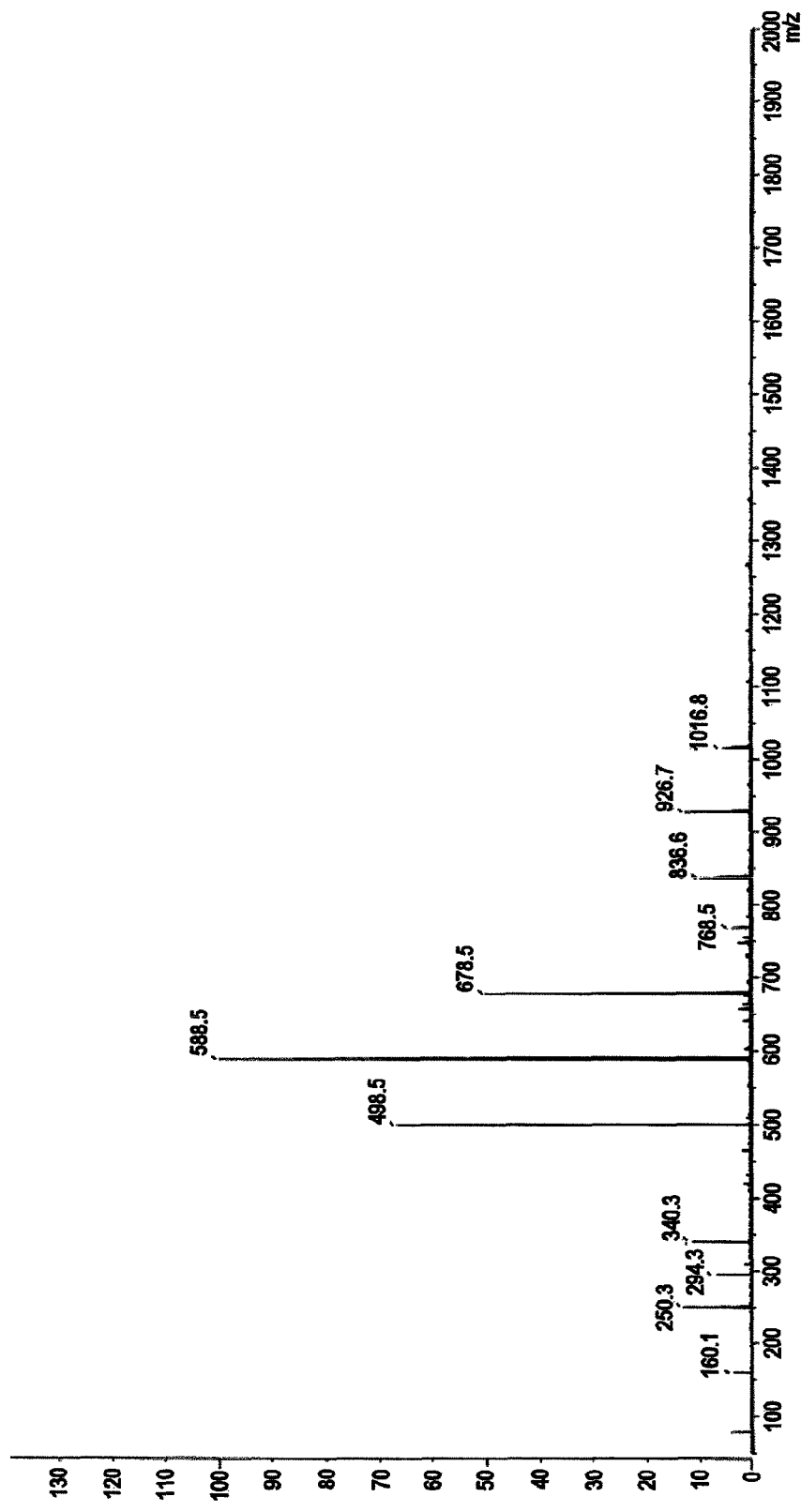
FIG. 7 is a FD-MS chart of a phenol resin 3 used in Examples and Comparative Examples.

Phenol resin 3: 100 parts by mass of 1,6-naphthalenediol (commercially available from Tokyo Chemical Industry, Co., Ltd., melting point: 136 degrees centigrade, molecular weight: 160.2, purity: 99.5%), 35.4 parts by mass of 4,4'-bischloromethylbiphenyl (bischloromethylbiphenyl, commercially available from Wako Pure Chemical Industries, Ltd., purity: 96%, molecular weight: 251) and 0.6 parts by mass of pure water were weighed in a separable flask. While the flask was purged with nitrogen, the resulting mixture was heated and began to be stirred in association with initiation of melting. The reaction was carried out for 15 minutes while maintaining the temperature in the system in the range of 150 to 160 degrees centigrade, and then 40 parts by mass of benzyl chloride (a special grade reagent, commercially available from Kanto Chemical Co., Inc., boiling point: 179 degrees centigrade, molecular weight: 126.6, purity: 99.5%) and 0.6 parts by mass of pure water were added dropwise to the reaction system, and further reacted for 2 hours. During the above reaction, hydrochloric acid generated in the system by the reaction was discharged out of the system by nitrogen flow. After completion of the reaction, remained hydrochloric acid and moisture were removed under reduced-pressure condition of 2 mmHg at 150 degrees centigrade, whereby a phenol resin 3 having the total of h1 to h4 of maximum 3 and having a structure represented by the following formula (14) (hydroxyl equivalent: 129, softening point: 67 degrees centigrade, ICI viscosity at 150 degrees centigrade: 1.8 dPa·s, content of n=0 calculated by the area method of GPC: 52%, content of n=0 to 2: 93%, mean value of n: 0.70, content of the component having a benzyl group in the phenol resin 3: 50% by area by the area method of GPC) was obtained. A GPC chart is illustrated in FIG. 6, while a FD-MS chart is illustrated in FIG. 7.

[Chemical Formula 15]

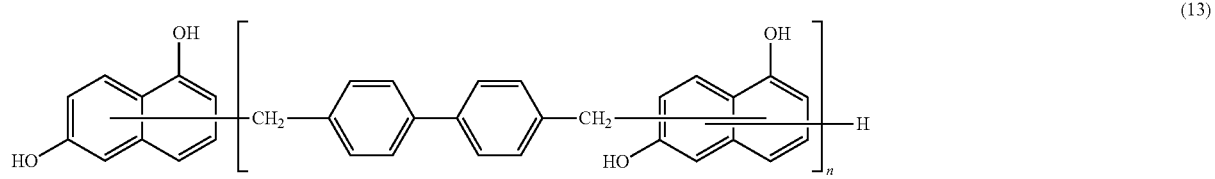

(13)

[Chemical Formula 16]

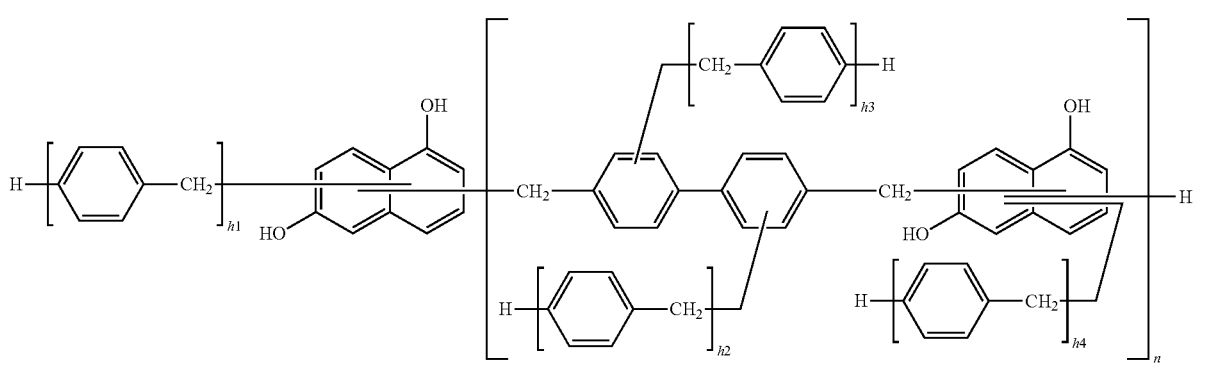

(14)

The phenol resins 4 to 7 were used as the phenol resin other than the phenol resin (A).

Phenol resin 4: A naphthalenediol aralkyl resin having a phenylene skeleton represented by the following formula (15) (SN-375, commercially available from Nippon Steel Chemical Co., Ltd., hydroxyl equivalent: 99, softening point: 70 degrees centigrade, ICI viscosity at 150 degrees centigrade: 0.7 dPa·s).

Phenol resin 5: A phenol aralkyl resin having a biphenylene skeleton (MEH-7851SS, commercially available from Meiwa Plastic Industries, Ltd., hydroxyl equivalent: 203, softening point: 67 degrees centigrade, ICI viscosity at 150 degrees centigrade: 0.7 dPa·s).

Phenol resin 6: A triphenylmethane type phenol resin (MEH-7500, commercially available from Meiwa Plastic Industries, Ltd., hydroxyl equivalent: 97, softening point: 110 degrees centigrade, ICI viscosity at 150 degrees centigrade: 5.8 dPa·s).

Phenol resin 7: A phenol novolac resin (PR-HF-3, commercially available from Sumitomo Bakelite Co., Ltd., hydroxyl equivalent: 104, softening point: 80 degrees centigrade, ICI viscosity at 150 degrees centigrade: 5.8 dPa·s).

[Chemical Formula 17]

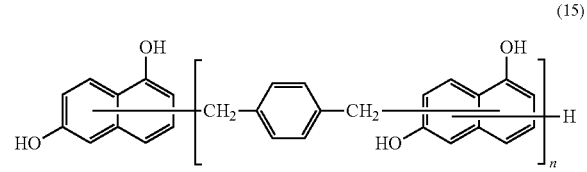

(15)

GPC measurement of the phenol resin 1 was carried out under the following conditions. To 20 mg of a sample of the phenol resin 1 was added 6 ml of a solvent tetrahydrofuran (THF), and the resulting mixture was fully dissolved and supplied for the GPC measurement. As a GPC system, there was used one in which a module W2695 commercially available from Waters Corporation, TSK GUARDCOLUMN HHR-L (diameter: 6.0 mm, tube length: 40 mm, guard column) commercially available from Tosoh Corporation, two of TSK-GEL GMHHR-L (diameter: 7.8 mm, tube length: 30 mm, polystyrene gel column) commercially available from Tosoh Corporation, and a differential refractive index (RI) detector W2414 commercially available from Waters Corporation were connected in series. The flow rate of the pump was set to 0.5 ml/min, the temperature in the column and the differential refractive index meter was set to 40 degrees centigrade, and 100 μl of a test solution was injected from an injector to carry out GPC measurement.

FD-MS measurement of the phenol resin 1 was carried out under the following conditions. To 10 mg of a sample of the phenol resin 1 was added 1 g of a solvent dimethyl sulfoxide, and the resulting mixture was fully dissolved, coated on the FD emitter, and then supplied for the FD-MS measurement. As a FD-MS system, there was used one obtained by connecting MS-FD15A commercially available from JEOL Ltd. to an ionization part and connecting MS-700 (model name, a double-focusing mass spectrometry device commercially available from JEOL Ltd.) to a detector to carry out the measurement in the detected mass range (m/z) of 50 to 2,000.

The following epoxy resins 1 to 9 were used for the epoxy resin.

Epoxy resin 1: A phenol aralkyl type epoxy resin having a biphenylene skeleton (NC3000, commercially available from Nippon Kayaku Co., Ltd., epoxy equivalent: 276, softening point: 58 degrees centigrade, ICI viscosity at 150 degrees centigrade: 1.11 dPa·s).

Epoxy resin 2: A phenol aralkyl type epoxy resin having a phenylene skeleton (NC2000, commercially available from Nippon Kayaku Co., Ltd., epoxy equivalent: 238, softening point: 52 degrees centigrade, ICI viscosity at 150 degrees centigrade: 1.2 dPa·s).

Epoxy resin 3: A modified ortho-cresol novolac type epoxy resin (HP-5000, commercially available from DIC Corporation, epoxy equivalent: 251, softening point: 58 degrees centigrade, ICI viscosity at 150 degrees centigrade: 0.85 dPa·s).

Epoxy resin 4: A dicyclopentadiene type epoxy resin (HP-7200L, commercially available from DIC Corporation, epoxy equivalent: 244, softening point: 56 degrees centigrade, ICI viscosity at 150 degrees centigrade: 0.24 dPa·s).

Epoxy resin 5: An ortho-cresol novolac type epoxy resin (N660, commercially available from DIC Corporation, epoxy equivalent: 210, softening point: 62 degrees centigrade, ICI viscosity at 150 degrees centigrade: 2.34 dPa·s).

Epoxy resin 6: A bisphenol F type epoxy resin (YSLV-80XY, commercially available from Nippon Steel Chemical Co., Ltd., epoxy equivalent: 190, melting point: 80 degrees centigrade, ICI viscosity at 150 degrees centigrade: 0.03 dPa·s).

Epoxy resin 7: A bisphenol A type epoxy resin (YL6810, commercially available from Japan Epoxy Resin Co., Ltd., epoxy equivalent: 172, melting point: 45 degrees centigrade, ICI viscosity at 150 degrees centigrade: 0.03 dPa·s).

Epoxy resin 8: A biphenyl type epoxy resin (YX4000K, commercially available from Japan Epoxy Resin Co., Ltd., epoxy equivalent: 185, melting point: 107 degrees centigrade, ICI viscosity at 150 degrees centigrade: 0.1 dPa·s).

Epoxy resin 9: A triphenylmethane type epoxy resin (1032H-60, commercially available from Japan Epoxy Resin Co., Ltd., epoxy equivalent: 171, softening point: 60 degrees centigrade, ICI viscosity at 150 degrees centigrade: 1.3 dPa·s).

As an inorganic filler, there was used a blend of 100 parts by mass of molten spherical silica FB560 commercially available from Denki Kagaku Kogyo Kabushiki Kaisha (average particle size: 30 μm), 6.5 parts by mass of synthetic spherical silica SO-C2 commercially available from Admatechs (average particle diameter: 0.5 μm), and 7.5 parts by mass of synthetic spherical silica SO-C5 commercially available from Admatechs (average particle diameter: 30 μm).

The following four compounds were used for the compound (D).

Compound (D1): A compound (D) represented by the following forula (16),

[Chemical Formula 18]

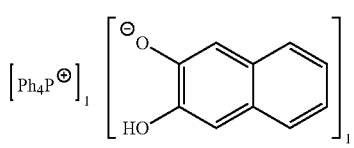

(16)

Compound (D2): A compound (D) represented by the following formula (17),

[Chemical Formula 19]

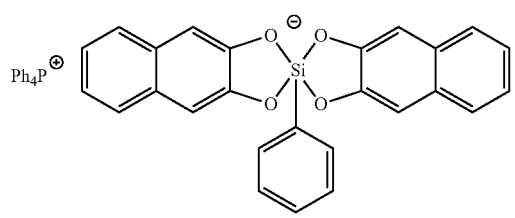

(17)

Compound (D3): A compound (D) represented by the following formula (18),

[Chemical Formula 20]

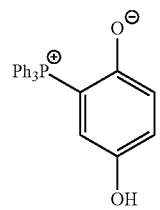

(18)

Compound (D4): A compound (D) represented by the following formula (19),

[Chemical Formula 21]

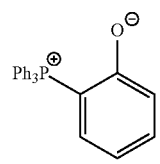

(19)

Triphenylphosphine was used as the other phosphorus compound.

As the compound (E), a compound represented by the following formula (20) (2,3-naphthalenediol, commercially available from Tokyo Chemical Industry, Co., Ltd., purity: 98%) was used,

[Chemical Formula 22]

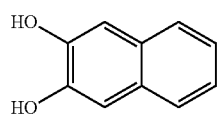

(20)

The following silane coupling agents 1 to 3 were used for the silane coupling agent.

Silane coupling agent 1: γ-mercaptopropyltrimethoxysilane (KBM-803, commercially available from Shin-Etsu Chemical Co., Ltd.).

Silane coupling agent 2: γ-glycidoxypropyltrimethoxysilane (KBM-403, commercially available from Shin-Etsu Chemical Co., Ltd.).

Silane coupling agent 3: N-phenyl-3-aminopropyltrimethoxysilane (KBM-573, commercially available from Shin-Etsu Chemical Co., Ltd.).

The following metal hydroxides 1 and 2 were used for the metal hydroxide.

Metal hydroxide 1: A complex metal hydroxide (magnesium hydroxide and zinc hydroxide solid solution, Echomag Z-10, commercially available from Tateho Chemical Industries Co., Ltd.).

Metal hydroxide 2: Aluminum hydroxide (CL310, commercially available from Sumitomo Chemical Co., Ltd.).

Phosphazene compound: Cyclophosphazene (SPE-100, commercially available from Otsuka Chemical Co., Ltd.).

Carbon black (MA600) commercially available from Mitsubishi Chemical Corporation was used for the coloring agent.

A carnauba wax commercially available from Fine Products Co., Ltd. (Nikko Carnauba, melting point: 83 degrees centigrade) was used for the releasing agent.

Example 1

The following components were mixed using a mixer at normal temperature, and melt-kneaded through a heating roller at 80 to 100 degrees centigrade. After being cooled, the mixture was pulverized to obtain a resin composition for encapsulating a semiconductor. The resulting resin composition for encapsulating a semiconductor was evaluated with respect to the following items. The evaluation results are shown in Table 1.

| | |
|---|---|
| Phenol resin 1 | 3.25 parts by mass |
| Epoxy resin 1 | 9.25 parts by mass |
| Inorganic filler | 86.50 parts by mass |
| Curing accelerator 1 (D1) | 0.40 parts by mass |
| Silane coupling agent 1 | 0.10 parts by mass |
| Silane coupling agent 2 | 0.05 parts by mass |
| Silane coupling agent 3 | 0.05 parts by mass |
| Coloring agent | 0.30 parts by mass |
| Releasing agent | 0.10 parts by mass |

Spiral Flow

The resin composition for encapsulating a semiconductor obtained in the above manner was injected into a spiral flow measuring mold built according to EMMI-1-66 under the conditions of a temperature of 175 degrees centigrade, an injection pressure of 6.9 MPa and a pressure application time of 120 seconds using a low pressure transfer molding machine (KTS-15, commercially available from Kohtaki Precision Machine Co., Ltd.), and the flow length was measured. The spiral flow is a parameter of flowability, and a greater value indicates higher flowability. The unit is cm.

Flame Resistance

The resin composition for encapsulating a semiconductor was injection-molded under the conditions of a mold temperature of 175 degrees centigrade, an injection pressure of 9.8 MPa, an injection time of 15 seconds and a curing time of 120 seconds using a low pressure transfer molding machine (KTS-30, commercially available from Kohtaki Precision Machine Co., Ltd.), whereby a flame-resistant test piece having a thickness of 3.2 mm was prepared and heated at 175 degrees centigrade for 4 hours. The prepared test piece was subjected to a flame resistance test in accordance with a standard specified in the UL-94 vertical method to determine flame resistance. Fmax, ΣF and rank of flame resistance after determination were shown in Tables. The resin composition for encapsulating a semiconductor obtained in the above exhibited excellent flame resistance, that is, Fmax of 7 seconds, ΣF of 24 seconds and rank of flame resistance of V-0.

Continuous Molding Property

The resin composition for encapsulating a semiconductor obtained in the above was placed in a tablet type having a weight of 7.5 g and a size of φ16 mm using a rotary tableting machine, and tableted under a tablet pressure of 600 Pa to obtain tablets. The tablets were placed in a tablet supply magazine and set inside the molding machine. Using a low pressure automatic transfer molding machine (SY-COMP, commercially available from Scinex Corporation), molding of a semiconductor device of 208-pin QFP (a Cu lead frame, package outer size: 28 mm×28 mm×3.2 mm (thickness), pad size: 15.5 mm×15.5 mm, chip size: 15.0 mm×15.0 mm×0.35 mm (thickness)) obtained by encapsulating a silicon chip or the like with the tablets of the resin composition for encapsulating a semiconductor was conducted up to 300 shots in a continuous manner under the conditions of a mold temperature of 175 degrees centigrade, an injection pressure of 9.8 MPa and a curing time of 60 seconds. In this case, the molding state (presence or absence of insufficient filling) of the semiconductor device per every 25 shots was confirmed, and then the number of shots where the insufficient filling was first confirmed was indicated in Tables. The resin composition for encapsulating a semiconductor obtained in the above exhibited excellent continuous molding property, that is, equal to or more than 300 shots.

Fixation Resistance 15 of the above-described tablets were set in the magazine such that 15 tablets were vertically stacked, and allowed to stand in a thermostat chamber at 25 and 30 degrees centigrade. Then, fixing condition of the tablets was checked after 8 hours. Among the above 14 tablet contact surfaces, the contact surface which was not separated by hand because of fixed surface was scored 1; the contact surface which was easily separated even though the fixed surface existed was scored 0.5; and the contact surface which was not fixed was scored 0. The total score was described in Table 4 under the item of fixation resistance. In the general continuous molding process, the tablets were in a vertically stacked state at a maximum height of 20 to 40 cm in the magazine inside the auto transfer unit of the molding machine, and were in a standby state at a surface temperature of about 20 to 30 degrees centigrade for about maximum 8 to 12 hours during the period until molding. For supplying and transferring the tablets in the molding machine, the uppermost tablet was pushed out from the upper part of the magazine by raising the push-up pin from the bottommost part of the magazine, lifted with a mechanical arm, and transferred to the pot for transfer molding. In this case, when the tablet waiting in the magazine was fixed on the upper or lower side, defective transfer took place and the productivity was impaired.

Boiling Water Absorption Rate

A disk-like test piece having a diameter of 50 mm and a thickness of 3 mm was formed at a mold temperature of 175 degrees centigrade and an injection pressure of 9.8 MPa for a curing time of 120 seconds using a low pressure transfer molding machine (KTS-30, commercially available from Kohtaki Precision Machine Co., Ltd.), and heated at 175 degrees centigrade for 4 hours. The weight change of the test piece before the hygroscopic treatment and after the boiling treatment in pure water for 24 hours was measured, and the water absorption of the test piece was expressed as a percentage. The unit is %. The resin composition for encapsulating a semiconductor obtained in the above exhibited low water absorption, that is, equal to or less than 0.27% (Reference Example 1).

Solder Resistance Test 1

The resin composition for encapsulating a semiconductor was injected under the conditions of a mold temperature of 180 degrees centigrade, an injection pressure of 7.4 MPa and a curing time of 120 seconds using a low pressure transfer molding machine (GP-ELF, commercially available from Dai-ichi Seiko Co., Ltd.) to perform encapsulation molding of a lead frame on which a semiconductor element (silicon chip) was mounted. Thus, a semiconductor device composed of 80p-QFP (quad flat package, a Cu lead frame, size: 14 mm×20 mm×2.00 mm (thickness), semiconductor element size: 7 mm×7 mm×0.35 mm (thickness), the semiconductor element being bonded to an inner lead part of a lead frame using a gold wire having a diameter of 25 μm) was prepared. The prepared six semiconductor devices heat-treated at 175 degrees centigrade for 4 hours were treated at 60 degrees centigrade and a relative humidity of 60% for 120 hours, and then an IR reflow process (at 260 degrees centigrade in accordance with the condition of JEDEC Level 2) was performed. The presence or absence of delamination and cracking inside the semiconductor devices after the processes was observed with a scanning acoustic tomograph (mi-scope 10, commercially available from Hitachi Kenki Fine Tech Co., Ltd.). Semiconductor devices in which at least one of delamination and cracking was caused were determined as defective. When the number of defective semiconductor devices was n, n/6 was indicated. The resin composition for encapsulating a semiconductor obtained in the above exhibited excellent reliability, that is, 0/6.

Solder Resistance Test 2

The test was carried out in the same manner as in Solder Resistance Test 1, except that the six semiconductor devices heat-treated at 175 degrees centigrade for 4 hours in the above Solder Resistance Test 1 were treated at a temperature of 85 degrees centigrade and a relative humidity of 60% for 168 hours. The semiconductor device prepared using the resin composition for encapsulating a semiconductor obtained in the above exhibited excellent reliability, that is, 0/6.

High-Temperature Storage Test

The resin composition for encapsulating a semiconductor was injected under the conditions of a mold temperature of 180 degrees centigrade, an injection pressure of 6.9±0.17 MPa and a period of 90 seconds using a low pressure transfer molding machine (GP-ELF, commercially available from Dai-ichi Seiko Co., Ltd.) to perform encapsulation molding of a lead frame on which a semiconductor element (silicon chip) was mounted. Thus, a semiconductor device composed of 16 pin DIP (dual inline package, 42 alloy lead frame, size: 7 mm×11.5 mm×1.8 mm (thickness), semiconductor element: 5 mm×9 mm×0.35 mm (thickness), the semiconductor element having an oxide layer having a thickness of 5 μm formed on its surface and further an aluminum wiring pattern having a line and space of 10 μm formed thereon, and being bonded to an aluminum wiring pad section and a lead frame pad section on the element using a gold wire having a diameter of 25 μm) was prepared. The initial resistances of the 10 semiconductor devices post-cured by being heat-treated at 175 degrees centigrade for 4 hours were measured, and a high-temperature storage treatment was carried out at 185 degrees centigrade for 1,000 hours. When the resistance of a semiconductor device after being subjected to a high temperature treatment was measured and it was 130% of the initial resistance of a semiconductor device, the semiconductor device was evaluated as defective. When the number of defective semiconductor devices was n, n/10 was indicated. The resin composition for encapsulating a semiconductor obtained in the above exhibited excellent reliability, that is, 0/10.

Examples 2 to 11, Comparative Examples 1 to 4

Resin compositions for encapsulating a semiconductor were prepared in the same manner as in Example 1 in accordance with the mixing amounts shown in Tables 1 to 3, and evaluated in the same manner as in Example 1. The evaluation results are shown in Tables 1 to 3.

TABLE 1

| | Example 1 | Example 2 | Example 3 | Example 4 | Example 5 | Example 6 |
|---|---|---|---|---|---|---|
| Epoxy resin 1 | 9.25 | 9.34 | 8.65 | | | |
| Epoxy resin 2 | | | | 8.96 | | |
| Epoxy resin 3 | | | | | 8.46 | |
| Epoxy resin 4 | | | | | | 9.01 |
| Phenol resin 1 | 3.25 | | | | | 3.59 |
| Phenol resin 2 | | 3.16 | | 3.51 | | |
| Phenol resin 3 | | | 3.85 | | 4.14 | |
| Inorganic filler 1 | 86.50 | 86.50 | 86.50 | 86.50 | 86.50 | 86.50 |
| Compound (D1) | 0.40 | 0.40 | 0.40 | | | |
| Compound (D2) | | | | 0.43 | | |
| Compound (D3) | | | | | 0.30 | |
| Compound (D4) | | | | | | 0.30 |
| Silane coupling agent 1 | 0.10 | 0.10 | 0.10 | 0.10 | 0.10 | 0.10 |
| Silane coupling agent 2 | 0.05 | 0.05 | 0.05 | 0.05 | 0.05 | 0.05 |
| Silane coupling agent 3 | 0.05 | 0.05 | 0.05 | 0.05 | 0.05 | 0.05 |
| Coloring agent | 0.30 | 0.30 | 0.30 | 0.30 | 0.30 | 0.30 |
| Releasing agent | 0.10 | 0.10 | 0.10 | 0.10 | 0.10 | 0.10 |
| Spiral flow (cm) | 110 | 106 | 114 | 124 | 108 | 106 |
| Flame resistance test ΣF (sec) | 13 | 12 | 24 | 12 | 15 | 14 |
| Flame resistance test Fmax (sec) | 3 | 2 | 5 | 4 | 2 | 5 |
| Flame resistance test rank | V-0 | V-0 | V-0 | V-0 | V-0 | V-0 |
| Continuous molding property test | 300 | 300 | 300 | 300 | 300 | 300 |
| Solder resistance test 1 (number of defective packages in n = 6) | 0/6 | 0/6 | 0/6 | 0/6 | 0/6 | 0/6 |
| Solder resistance test 2 (number of defective packages in n = 6) | 0/6 | 0/6 | 0/6 | 0/6 | 0/6 | 0/6 |
| High-temperature storage characteristics (number of defective packages in n = 10) | 0/10 | 0/10 | 0/10 | 0/10 | 0/10 | 0/10 |

TABLE 2

| | Example 7 | Example 8 | Example 9 | Example 10 | Example 11 |
|---|---|---|---|---|---|
| Epoxy resin 5 | 8.76 | | | | |
| Epoxy resin 6 | | 7.59 | | | |
| Epoxy resin 7 | | | 7.99 | | |
| Epoxy resin 8 | | | | 8.31 | |
| Epoxy resin 9 | | | | | 7.65 |
| Phenol resin 1 | | | 4.51 | | 2.43 |
| Phenol resin 2 | 3.89 | | | 4.19 | |
| Phenol resin 3 | | 4.91 | | | 2.43 |
| Inorganic filler 1 | 86.50 | 85.50 | 85.50 | 86.50 | 86.50 |
| Compound (D1) | | 0.40 | 0.40 | 0.40 | 0.40 |
| Triphenylphosphine | 0.20 | | | | |
| Compound (E) | 0.05 | | | | |
| Silane coupling agent 1 | 0.10 | 0.10 | 0.10 | 0.10 | 0.10 |
| Silane coupling agent 2 | 0.05 | 0.05 | 0.05 | 0.05 | 0.05 |
| Silane coupling agent 3 | 0.05 | 0.05 | 0.05 | 0.05 | 0.05 |
| Metal hydroxide 1 | | 1.00 | | | |

TABLE 2-continued

|  | Example 7 | Example 8 | Example 9 | Example 10 | Example 11 |
|---|---|---|---|---|---|
| Metal hydroxide 2 |  |  | 1.00 |  |  |
| Coloring agent | 0.30 | 0.30 | 0.30 | 0.30 | 0.30 |
| Releasing agent | 0.10 | 0.10 | 0.10 | 0.10 | 0.10 |
| Spiral flow (cm) | 104 | 108 | 110 | 108 | 96 |
| Flame resistance test ΣF (sec) | 18 | 18 | 21 | 28 | 48 |
| Flame resistance test Fmax (sec) | 3 | 6 | 6 | 6 | 9 |
| Flame resistance test rank | V-0 | V-0 | V-0 | V-0 | V-0 |
| Continuous molding property test | 300 | 300 | 300 | 300 | 300 |
| Solder resistance test 1 (number of defective packages in n = 6) | 0/6 | 0/6 | 0/6 | 0/6 | 0/6 |
| Solder resistance test 2 (number of defective packages in n = 6) | 0/6 | 0/6 | 0/6 | 0/6 | 0/6 |
| High-temperature storage characteristics (number of defective packages in n = 10) | 0/10 | 0/10 | 0/10 | 0/10 | 0/10 |

TABLE 3

|  | Comparative Example 1 | Comparative Example 2 | Comparative Example 3 | Comparative Example 4 |
|---|---|---|---|---|
| Epoxy resin 1 | 9.32 | 7.35 | 9.37 |  |
| Epoxy resin 8 |  |  |  | 8.14 |
| Phenol resin 4 | 3.18 |  |  |  |
| Phenol resin 5 |  | 5.15 |  |  |
| Phenol resin 6 |  |  | 3.13 |  |
| Phenol resin 7 |  |  |  | 4.36 |
| Inorganic filler 1 | 86.50 | 85.50 | 86.50 | 85.50 |
| Compound (D1) | 0.40 | 0.40 | 0.40 | 0.40 |
| Silane coupling agent 1 | 0.10 | 0.10 | 0.10 | 0.10 |
| Silane coupling agent 2 | 0.05 | 0.05 | 0.05 | 0.05 |
| Silane coupling agent 3 | 0.05 | 0.05 | 0.05 | 0.05 |
| Metal hydroxide 1 |  | 1.00 |  |  |
| Phosphazene compound |  |  |  | 1.00 |
| Coloring agent | 0.30 | 0.30 | 0.30 | 0.30 |
| Releasing agent | 0.10 | 0.10 | 0.10 | 0.10 |
| Spiral flow (cm) | 103 | 97 | 82 | 102 |
| Flame resistance test ΣF (sec) | 34 | 12 | 51 | 11 |
| Flame resistance test Fmax (sec) | 7 | 3 | 10 | 3 |
| Flame resistance test rank | V-0 | V-0 | V-1 | V-0 |
| Continuous molding property test | 250 | 175 | 300 | 150 |
| Solder resistance test 1 (number of defective packages in n = 6) | 0/6 | 0/6 | 3/6 | 0/6 |
| Solder resistance test 2 (number of defective packages in n = 6) | 2/6 | 0/6 | 6/6 | 1/6 |
| High-temperature storage characteristics (number of defective packages in n = 10) | 1/10 | 8/10 | 0/10 | 0/10 |

In each of Examples 1 to 11, there were used a resin composition containing a phenol resin (A) having structural units represented by the formulae (1) and (2), an epoxy resin (B), and an inorganic filler (C), and one obtained by changing the ratio of the structural units of the phenol resin (A), one obtained by changing the kind of the epoxy resin (B), one obtained by changing the kind of the compound (D), one containing the compound (E), or one obtained by changing the flame retardant. The results showed that, in all of Examples 1 to 11, an excellent balance among flowability (spiral flow), flame resistance, continuous molding property, solder resistance, and high-temperature storage characteristics was exhibited.

On the other hand, in Comparative Example 1 using a naphthalenediol aralkyl resin having a phenylene skeleton as the curing agent, the hydroxyl group density was high, so that moisture was easily absorbed, and as a result, solder resistance was not sufficient. Further, the miscibility with the phenol aralkyl type epoxy resin having a biphenylene skeleton was not sufficient, and as a result, continuous molding property was not sufficient. In Comparative Example 2 using a phenol aralkyl resin having a biphenylene skeleton as the curing agent, the resin component was easily accumulated on the mold surface during continuous molding due to low curability and high lipophilicity, and as a result, continuous molding property was not sufficient. Further, high-temperature storage characteristics were not sufficient either due to low glass transition temperature. In Comparative Example 3 using a triphenylmethane type phenol resin as the curing agent, the crosslink density was high, so that cracks occur to the resin surface during combustion, and flame resistance was not sufficient; the hydroxyl group density and the crosslink density were high, so that water absorption was high; and the thermal stress at the solder reflow temperature was high, so that solder resistance was not sufficient.

As shown in the above results, only when a resin composition using the phenol resin (A) of the present invention was used, the results showed that the resin composition obtained an excellent balance among flowability (spiral flow), flame resistance, continuous molding property, solder resistance and high-temperature storage characteristics. More remarkable effects were resulted than expected.

Incidentally, the evaluation results of fixation property and water absorption carried out using the resin compositions of Examples 1 to 3 are illustrated as Reference Examples below.

As is apparent from Reference Examples 1 and 2, the results showed that fixation resistance was also excellent in addition to an excellent balance among the aforementioned properties when the resin compositions of Examples 1 to 3 were used.

On the other hand, the resin composition used in Example 3 shown in Reference Example 3 is expected to exhibit excellent solder resistance under more harsh conditions because of excellent low water absorption.

Accordingly, it is guessed that the resin composition is suitably applicable to a semiconductor encapsulating material requiring much higher reliability.

TABLE 4

|  | Unit | Reference Example 1 | Reference Example 2 | Reference Example 3 |
|---|---|---|---|---|
| Epoxy resin 1 |  | 9.25 | 9.34 | 8.65 |
| Phenol resin 1 |  | 3.25 |  |  |
| Phenol resin 2 |  |  | 3.16 |  |
| Phenol resin 3 |  |  |  | 3.85 |
| Inorganic filler 1 |  | 86.50 | 86.50 | 86.50 |
| Compound (D1) |  | 0.40 | 0.40 | 0.40 |
| Silane coupling agent 1 |  | 0.10 | 0.10 | 0.10 |
| Silane coupling agent 2 |  | 0.05 | 0.05 | 0.05 |
| Silane coupling agent 3 |  | 0.05 | 0.05 | 0.05 |
| Coloring agent |  | 0.30 | 0.30 | 0.30 |
| Releasing agent |  | 0.10 | 0.10 | 0.10 |
| Evaluation of fixation resistance (25° C.) | (point) | 0 | 2.5 | 0 |
| Evaluation of fixation resistance (30° C.) | (point) | 3.5 | 6.5 | 0.5 |
| Boiling water absorption rate | (%) | 0.27 | 0.27 | 0.24 |

According to the present invention, it is possible to obtain a resin composition for encapsulating a semiconductor which is excellent in flowability (spiral flow), flame resistance and solder resistance, and also excellent in continuous molding property and high-temperature storage characteristics. Thus, the resin composition is suitable for encapsulating a semiconductor device.

Incidentally, it is to be understood that the aforementioned embodiments and a plurality of modifications may be made without departing from the scope of the invention. Furthermore, the structures of respective portions and the like are described in the aforementioned embodiments and modifications in detail, but they may be modified in many ways within the range of the present invention.

This application is based on Japanese patent application No. 2009-148048 filed on Jun. 22, 2009, the content of which is incorporated hereinto by reference.

The invention claimed is:

1. A resin composition for encapsulating a semiconductor comprising a phenol resin (A) containing a component represented by the following general formula (1);
an epoxy resin (B); and
an inorganic filler (C),

[Chemical Formula 1]

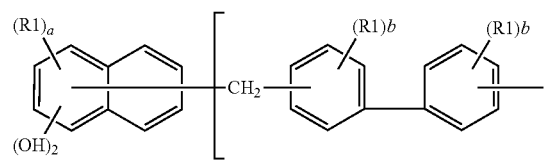

(1)

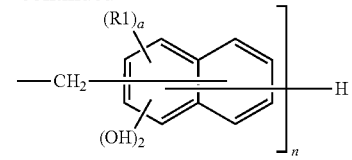

wherein, in the general formula (1), two hydroxyl groups bonded to the same naphthalene group are bonded to different carbon atoms on a naphthalene ring; R1 is each independently a hydrocarbon group having 1 to 60 carbon atoms; as are each independently an integer of 0 to 5; b is each independently an integer of 0 to 4; and n is an integer of 1 to 10.

2. The resin composition for encapsulating a semiconductor according to claim 1, wherein said phenol resin (A) contains a component in which R1 in said general formula (1) is a group represented by the following general formula (2),

[Chemical Formula 2]

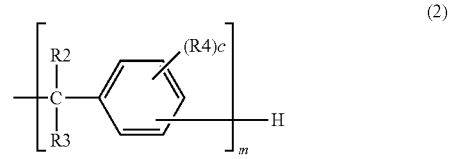

(2)

wherein, in the general formula (2), R2 and R3 are each independently a hydrogen atom or a hydrocarbon group having 1 to 3 carbon atoms; R4 is each independently a hydrocarbon group having 1 to 3 carbon atoms; c is each independently an integer of 0 to 4; and m is an integer of 1 to 5.

3. The resin composition for encapsulating a semiconductor according to claim 1, wherein said phenol resin (A) contains a component with n=0 to 2 in an amount of equal to or more than 50% by mass and equal to or less than 100% by mass, based on the total phenol resin (A).

4. The resin composition for encapsulating a semiconductor according to claim 1, wherein said phenol resin (A) contains a component with n=0 in an amount of equal to or more than 25% by mass and equal to or less than 70% by mass, based on the total phenol resin (A).

5. The resin composition for encapsulating a semiconductor according to claim 2, wherein said phenol resin (A) contains a component in which R1 is a group represented by said general formula (2) in an amount of equal to or more than 20% by area and equal to or less than 80% by area, based on the total phenol resin (A), in the area conversion method of the gel permeation chromatography (GPC) measurement method.

6. A semiconductor device obtained by encapsulating a semiconductor element using the resin composition for encapsulating a semiconductor according to claim 1.

* * * * *